United States Patent
Fukagawa

(10) Patent No.: US 11,502,281 B2
(45) Date of Patent: Nov. 15, 2022

(54) METHOD FOR MANUFACTURING ELECTROOPTICAL DEVICE COMPRISING CUTTING A SUBSTRATE WITH A LASER BEAM, METHOD FOR MANUFACTURING ORGANIC ELECTROLUMINESCENCE DEVICE, ORGANIC ELECTROLUMINESCENCE DEVICE, AND ELECTRONIC APPARATUS

(71) Applicant: SEIKO EPSON CORPORATION, Tokyo (JP)

(72) Inventor: Takefumi Fukagawa, Suwa-gun (JP)

(73) Assignee: SEIKO EPSON CORPORATION, Tokyo (JP)

( * ) Notice: Subject to any disclaimer, the term of this patent is extended or adjusted under 35 U.S.C. 154(b) by 288 days.

(21) Appl. No.: 16/850,139

(22) Filed: Apr. 16, 2020

(65) Prior Publication Data

US 2020/0335731 A1 Oct. 22, 2020

(30) Foreign Application Priority Data

Apr. 17, 2019 (JP) .............................. JP2019-078568

(51) Int. Cl.
*H01L 51/56* (2006.01)
*H01L 51/52* (2006.01)
*H01L 51/50* (2006.01)

(52) U.S. Cl.
CPC .......... *H01L 51/56* (2013.01); *H01L 51/5012* (2013.01); *H01L 51/5262* (2013.01)

(58) Field of Classification Search
CPC . H01L 51/56; H01L 51/5012; H01L 51/5262; H01L 51/5246; H01L 51/5253; H01L 51/524; H01L 51/5265; H01L 51/5271; H01L 27/322; H01L 2251/5315; H01L 2251/566

(Continued)

(56) References Cited

U.S. PATENT DOCUMENTS

2011/0256344 A1* 10/2011 Ono .................... H01L 23/15
428/131
2015/0038313 A1 2/2015 Hosseini (Continued)

FOREIGN PATENT DOCUMENTS

JP 2009-216757 A 9/2009
JP 2011-107432 A 6/2011

(Continued)

*Primary Examiner* — Thao X Le
*Assistant Examiner* — Gardner W. S. Swan
(74) *Attorney, Agent, or Firm* — Oliff PLC

(57) ABSTRACT

A method for manufacturing an electro-optical device according to the present disclosure includes bonding a counter substrate to a substrate, cutting a first portion by irradiation of a laser beam, and removing the first portion, wherein during cutting of the first portion, a first surface and a second surface sandwiching the first portion in plan view are formed by the irradiation of the laser beam, one or both of the first surface and the second surface is inclined with respect to a first plate surface, and a first distance between the first surface and the second surface in the first plate surface is greater than a second distance between the first surface and the second surface in a second plate surface, on the substrate side, of the counter substrate.

6 Claims, 18 Drawing Sheets

(58) Field of Classification Search
USPC .......................................................... 257/40
See application file for complete search history.

(56)      References Cited

U.S. PATENT DOCUMENTS

| | | | | |
|---|---|---|---|---|
| 2017/0194605 | A1* | 7/2017 | Kuji | ........................ H01L 51/56 |
| 2018/0144951 | A1* | 5/2018 | Koelling | ............... H01L 21/486 |
| 2019/0088909 | A1* | 3/2019 | Cheon | ................. H01L 51/0031 |
| 2020/0381662 | A1* | 12/2020 | Andou | .................. H05B 33/10 |
| 2021/0028271 | A1* | 1/2021 | Park | .................... H01L 51/5246 |

FOREIGN PATENT DOCUMENTS

| | | | |
|---|---|---|---|
| JP | 2013-223886 | A | 10/2013 |
| JP | 2016-143605 | A | 8/2016 |
| JP | 2017-213603 | A | 12/2017 |
| JP | 2017-221977 | A | 12/2017 |
| JP | 2018-157230 | A | 10/2018 |

* cited by examiner

METHOD FOR MANUFACTURING ELECTROOPTICAL DEVICE COMPRISING CUTTING A SUBSTRATE WITH A LASER BEAM, METHOD FOR MANUFACTURING ORGANIC ELECTROLUMINESCENCE DEVICE, ORGANIC ELECTROLUMINESCENCE DEVICE, AND ELECTRONIC APPARATUS

The present application is based on, and claims priority from JP Application Serial Number 2019-078568, filed Apr. 17, 2019, the disclosure of which is hereby incorporated by reference herein in its entirety.

BACKGROUND

1. Technical Field

The present disclosure relates to a method for manufacturing an electro-optical device, a method for manufacturing an organic electroluminescence device, an organic electroluminescence device, and an electronic apparatus.

2. Related Art

An electro-optical device such as an organic EL device using an organic EL (electroluminescence) element is known. JP-A-2016-143605 discloses an organic EL device including an element substrate on which an organic EL element and an external connection terminal are provided, and a counter substrate arranged opposite to the element substrate. In the manufacturing of the organic EL device, a chip mount method in which individual counter substrate is bonded to each of a plurality of element substrates multi-sided on a mother substrate is used.

However, in the chip mount method described in JP-A-2016-143605, for example, when the distance between the external connection terminal and the organic EL element becomes short, it becomes difficult to arrange the counter substrate so as not to interfere with the external connection terminal. Furthermore, as the number of counter substrates arranged on the mother substrate increases, the tact time becomes longer. As described above, in the related art, there is a problem that it is difficult to efficiently manufacture an electro-optical device having stable quality.

SUMMARY

An aspect of a method for manufacturing an electro-optical device according to the present disclosure includes bonding a counter substrate to a substrate on which a pixel electrode, a circuit electrically coupled to the pixel electrode, and a terminal electrically coupled to the circuit are provided, cutting a first portion corresponding to the terminal from the counter substrate by irradiating the counter substrate with a laser beam, and removing the first portion from the counter substrate, wherein during cutting of the first portion, a first surface and a second surface sandwiching the first portion in plan view are formed on the counter substrate by irradiation of the laser beam, one or both of the first surface and the second surface is inclined with respect to a first plate surface on an opposite side of the counter substrate to the substrate, and a first distance between the first surface and the second surface in the first plate surface is greater than a second distance between the first surface and the second surface in a second plate surface, on the substrate side, of the counter substrate.

An aspect of a method for manufacturing an organic electroluminescence device of the present disclosure includes forming a protective layer overlapping an organic electroluminescence element, a circuit and a terminal in plan view on a circuit board on which the organic electroluminescence element, the circuit electrically coupled to the organic electroluminescence element, and the terminal electrically coupled to the circuit are provided, bonding a counter substrate to the protective layer, cutting a first portion corresponding to the terminal from the counter substrate by irradiating the counter substrate with a laser beam, removing the first portion from the counter substrate, and removing a portion of the protective layer overlapping the terminal in the plan view, wherein during cutting of the first portion, a first surface and a second surface sandwiching the first portion in the plan view are formed on the counter substrate by irradiation of the laser beam, one or both of the first surface and the second surface are inclined with respect to a first plate surface on an opposite side of the counter substrate to the protective layer, and a first distance between the first surface and the second surface in the first plate surface is greater than a second distance between the first surface and the second surface in a second plate surface, on the protective layer side, of the counter substrate.

An aspect of an organic electroluminescence device of the present disclosure includes a circuit board on which an organic electroluminescence element, a circuit electrically coupled to the organic electroluminescence element, and a terminal electrically coupled to the circuit are provided, a counter substrate overlapping the organic electroluminescence element and the circuit in plan view, and having a quadrangular shape in the plan view, and a protective layer arranged between the organic electroluminescence element and the counter substrate, wherein the terminal is located outside the counter substrate in the plan view, the counter substrate includes a first plate surface on an opposite side of the counter substrate to the protective layer, a second plate surface of the counter substrate on the protective layer side, and a side surface including four faces connecting the first plate surface and the second plate surface, and the surface closest to the terminal among the four faces is an inclined surface inclined with respect to the first plate surface in a direction such that an area of the first plate surface is smaller than an area of the second plate surface.

DESCRIPTION OF EXEMPLARY EMBODIMENTS

Figure 1:
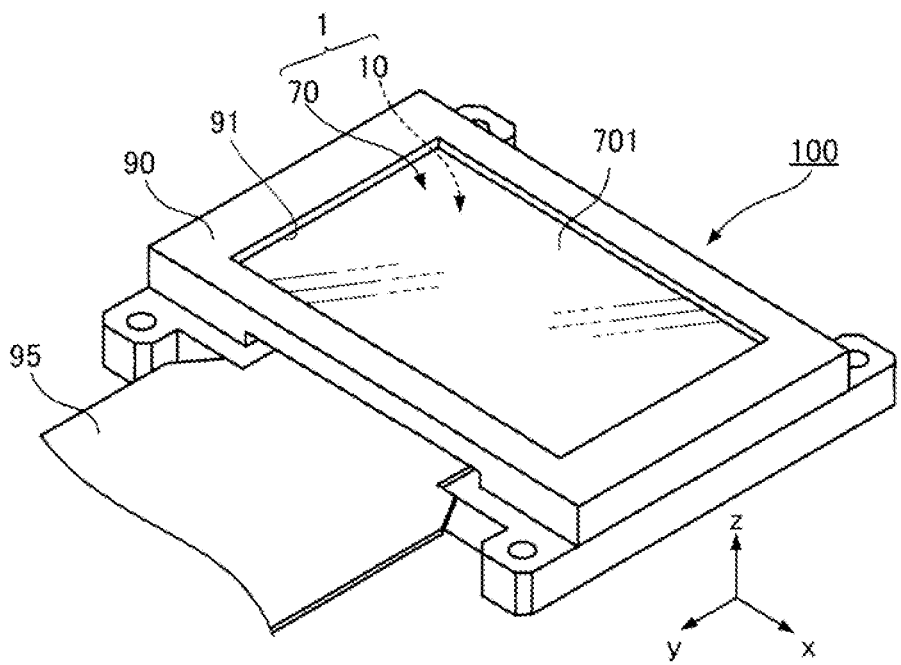
FIG. 1 is a perspective view illustrating an electro-optical device according to a first embodiment.

Preferred embodiments of the present disclosure will be described below with reference to the accompanying drawings. Note that, in the drawings, dimensions and scales of sections are differed from actual dimensions and scales as appropriate, and some of the sections are schematically illustrated to make them easily recognizable. Further, the scope of the present disclosure is not limited to these embodiments unless otherwise stated to limit the present disclosure in the following descriptions.

1. Electro-Optical Device 100 and Method for Manufacturing Electro-Optical Device 100

1A. First Embodiment

FIG. 1 is a perspective view illustrating an electro-optical device 100 according to a first embodiment. Note that, for convenience of explanation, the description will be made appropriately using an x-axis, a y-axis, and a z-axis orthogonal to each other illustrated in FIG. 1. A first plate surface 701 of a counter substrate 70 included in a display panel 1 described below is parallel to an x-y plane, and a direction in which the counter substrate 70 and a substrate 10 overlap is a −z direction. Further, viewing from the −z direction is referred to as "plan view". The thickness direction of the substrate 10 is a direction parallel to the −z direction. Further, the thickness direction of a circuit board 12 described below is also a direction parallel to the −z direction. Further, in the following description, "translucency" refers to transparency to visible light, and means that a transmittance of visible light may be greater than or equal to 50%.

1A-1. Overall Configuration of Organic EL Device

The electro-optical device 100 illustrated in FIG. 1 is an example of an "organic electroluminescence device", and is an organic EL (electroluminescence) display device configured to display a full color image. The electro-optical device 100 includes a case 90 including an opening 91, a display panel 1 provided in the case 90, and a Flexible Printed Circuit (FPC) substrate 95 electrically coupled to the display panel 1. The display panel 1 includes a substrate 10 and a counter substrate 70 that is configured to protect the substrate 10 and has translucency. The counter substrate 70 is located on the +z axis side of the substrate 10, a portion thereof is exposed from the opening 91.

Although not illustrated, the FPC substrate 95 is coupled to an upper circuit provided outside. The display panel 1 is coupled to a power supply circuit (not illustrated). Note that, the electro-optical device 100 may have a configuration in which the case 90 and the FPC substrate 95 are omitted. In this case, the display panel 1 corresponds to the electro-optical device 100.

Figure 2:
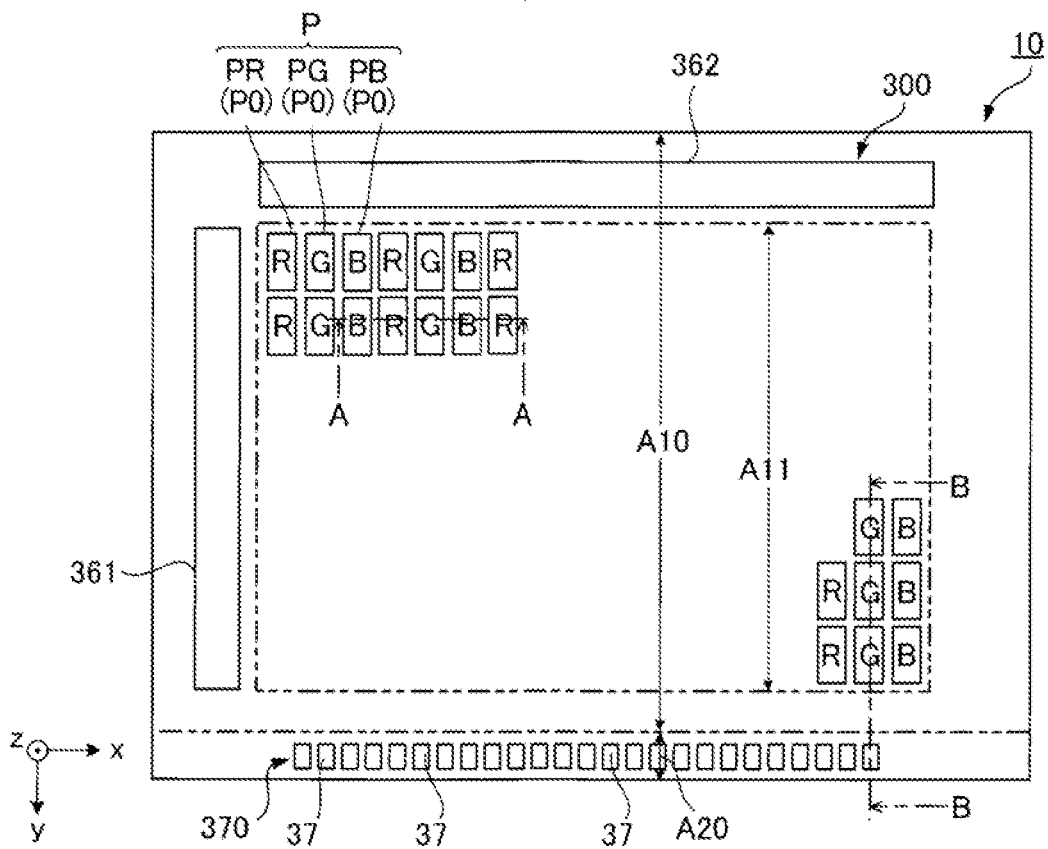
FIG. 2 is a schematic plan view illustrating a substrate including a display panel according to the first embodiment.

FIG. 2 is a schematic plan view illustrating the substrate 10 including the display panel 1 according to the first embodiment. As illustrated in FIG. 2, the substrate 10 includes a circuit region A10 having a square shape in plan view, and a terminal region A20 located on the +y axis side of the circuit region A10 in plan view. In the circuit region A10, a plurality of sub-pixels P0, a scanning line drive circuit 361, and a data line drive circuit 362 are provided. On the other hand, in the terminal region A20, a terminal group 370 including a plurality of terminals 37 is provided. Further, a region in the circuit region A10 in which the plurality of sub-pixels P0 are arranged constitutes a display region A11 for displaying an image.

The plurality of sub-pixels P0 are provided in a matrix of M rows and N columns. Specifically, a plurality of sub-pixels PB corresponding to a blue wavelength region, a plurality of sub-pixels PG corresponding to a green wavelength region, and a plurality of sub-pixels PR corresponding to a red wavelength region are provided in the display panel 1. One pixel P includes one sub-pixel PB, one sub-pixel PG, and one sub-pixel PR. Note that, in the present specification, when the sub-pixel PB, the sub-pixel PG, and the sub-pixel PR are not differentiated, they are expressed as the sub-pixel P0. The sub-pixels PB, the sub-pixels PG, and the sub-pixels PR are arranged in the same color along a y direction, and are arranged repeatedly in the order of red, green, and blue along an x direction. Note that, the arrangement of the sub-pixels PB, the sub-pixels PG, and the sub-pixels PR is not limited to the illustrated example, and may be a so-called delta method, for example.

The scanning line drive circuit 361 and the data line drive circuit 362 constitute part of a circuit 300. The circuit 300 includes a scanning line drive circuit 361, a data line drive circuit 362, and a pixel circuit 30 described below included in each sub-pixel P0. Furthermore, the plurality of terminals 37 are aligned along the +x direction. Each terminal 37 is electrically coupled to the FPC substrate 95. Further, each terminal 37 is electrically coupled to the circuit 300 via wiring (not illustrated).

1A-2. Electrical Configuration of Display Panel 1

Figure 3:
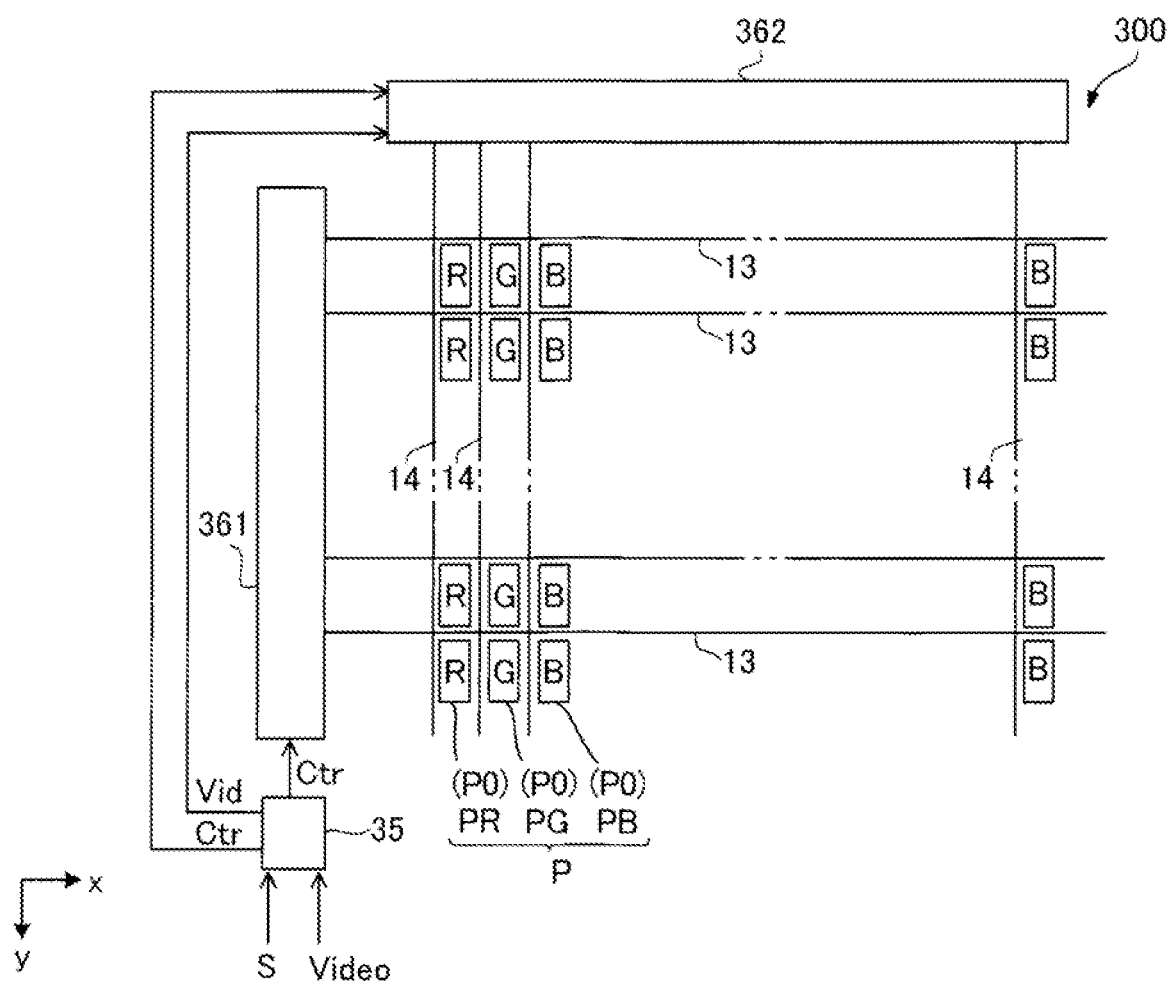
FIG. 3 is a block diagram illustrating an electrical configuration of the display panel according to the first embodiment.

FIG. 3 is a block diagram illustrating an electrical configuration of the display panel 1 according to the first embodiment. As illustrated in FIG. 3, the substrate 10 includes M scanning lines 13 extending along the +x direction, and N data lines 14 intersecting the scanning lines 13 and extending along the +y direction. Note that M and N are natural numbers. Further, the plurality of sub-pixels P0 are constituted so as to correspond to intersections between the M scanning lines 13 and the N data lines 14. The circuit 300 also includes various wirings such as the scanning lines 13 and the data lines 14.

A control circuit 35 is configured to control display of an image. Note that, the control circuit 35 is provided on the FPC substrate 95, but may be arranged on the display panel 1, for example. Image data Video, which is digital, is supplied from the upper circuit (not illustrated) synchronously with a synchronization signal S to the control circuit 35. The control circuit 35 generates a control signal Ctr based on the synchronization signal S, and supplies the control signal Ctr to the scanning line drive circuit 361 and the data line drive circuit 362. Further, the control circuit 35 generates an image signal Vid, which is analog, based on the image data Video, and supplies the image signal Vid to the data line drive circuit 362. Note that the image data Video described above is data that defines a gradation level of the sub-pixels P0 by, for example, eight bits. The synchronization signal S is a signal including a vertical synchronization signal, a horizontal synchronization signal, and a dot clock signal.

The scanning line drive circuit 361 is coupled to the M scanning lines 13. Based on the control signal Ctr, the scanning line drive circuit 361 generates a scanning signal for sequentially selecting the M scanning lines 13 one by one within one frame period, and outputs the generated scanning signal to the M scanning lines 13. Further, the data line drive circuit 362 is coupled to the N data lines 14. Based on the image signal Vid and the control signal Ctr, the data line drive circuit 362 generates a data signal according to gradation to be displayed, and outputs the generated data signal to the N data lines 14.

Note that the scanning line drive circuit 361 and the data line drive circuit 362 may be integrated as one drive circuit. Further, the control circuit 35, the scanning line drive circuit 361, and the data line drive circuit 362 may be respectively divided into a plurality of circuits.

Figure 4:
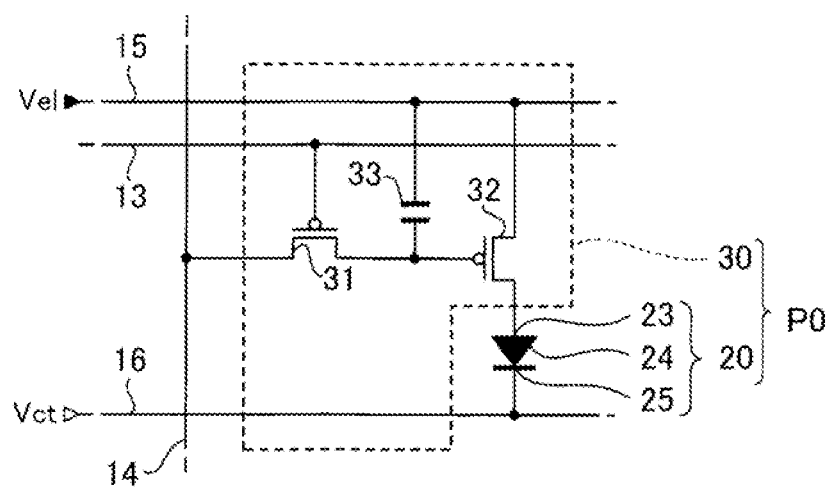
FIG. 4 is an equivalent circuit diagram of a sub-pixel according to the first embodiment.

FIG. 4 is an equivalent circuit diagram of the sub-pixel P0 according to the first embodiment. As illustrated in FIG. 4, the sub-pixel P0 includes an organic EL element 20 and a pixel circuit 30 that controls driving of the organic EL element 20.

The organic EL (electroluminescence) element 20 includes a pixel electrode 23, an organic layer 24, and a common electrode 25. The pixel electrode 23 functions as an anode and supplies holes to the organic layer 24. The common electrode 25 functions as a cathode and supplies electrons to the organic layer 24. In the organic EL element 20, the holes supplied from the pixel electrode 23 and the electrons supplied from the common electrode 25 are recombined in the organic layer 24, and causes the organic layer 24 to emit white light. Note that, a power supplying line 16 is electrically coupled to the common electrode 25. A power supply potential Vct on a low potential side is supplied from the power supply circuit (not illustrated) to the power supplying line 16.

The pixel circuit 30 includes a switching transistor 31, a driving transistor 32, and a retention capacitor 33. A gate of the switching transistor 31 is electrically coupled to the scanning line 13. Further, one of a source and a drain of the switching transistor 31 is electrically coupled to the data line 14, and the other is electrically coupled to agate of the driving transistor 32. Further, one of a source and a drain of the driving transistor 32 is electrically coupled to the power supplying line 15, and the other is electrically coupled to the pixel electrode 23. Note that a power supply potential Vel on a high potential side is supplied from the power supply circuit (not illustrated) to the power supplying line 15. Further, one of electrodes of the retention capacitor 33 is coupled to the gate of the driving transistor 32, and the other electrode is coupled to the power supplying line 15.

When the scanning line drive circuit 361 activates the scanning signal to select the scanning line 13, the switching transistor 31 provided in the selected sub-pixel P0 is turned on. Then, the data signal is supplied from the data line 14 to the driving transistor 32 corresponding to the selected scanning line 13. The driving transistor 32 supplies, to the organic EL element 20, a current corresponding to a potential of the supplied data signal, that is, a current corresponding to a potential difference between the gate and the source. Then, the organic EL element 20 emits light at a luminance corresponding to a magnitude of the current supplied from the driving transistor 32. Further, when the scanning line drive circuit 361 releases the selection of the scanning line 13 and the switching transistor 31 is turned off, the potential of the gate of the driving transistor 32 is held by the retention capacitor 33. Thus, the organic EL element 20 can emit light even after the switching transistor 31 is turned off.

Note that the configuration of the pixel circuit 30 described above is not limited to the illustrated configuration. For example, the pixel circuit 30 may further include a transistor that controls the conduction between the pixel electrode 23 and the driving transistor 32.

1A-3. Configuration of Display Panel 1

Figure 5:
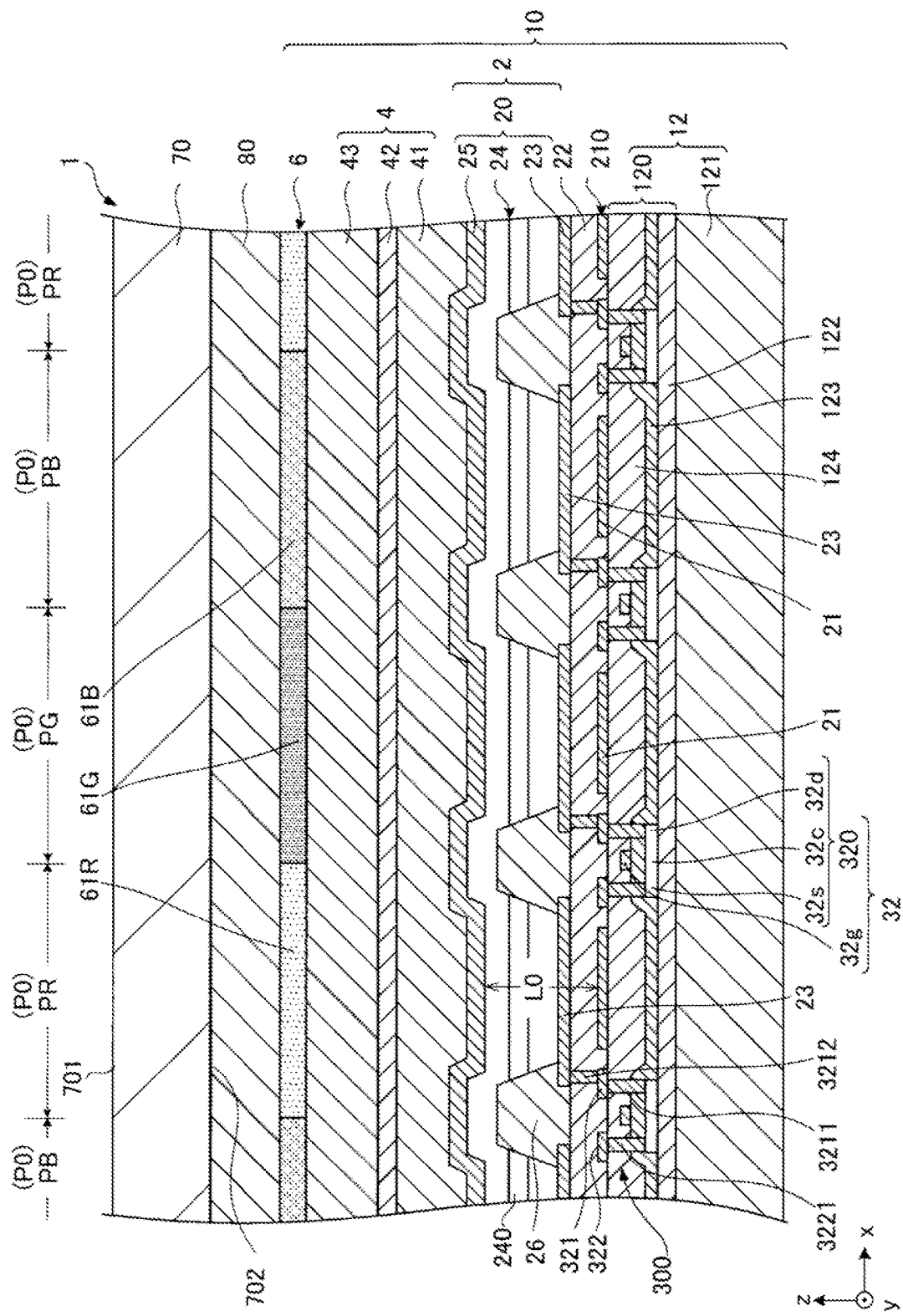
FIG. 5 is a partial cross-sectional view of the display panel according to the first embodiment.

FIG. 5 is a partial cross-sectional view of the display panel 1 according to the first embodiment, and is a cross-sectional view of the display panel 1 taken along an A-A line in FIG. 2. As illustrated in FIG. 5, the display panel 1 includes a substrate 10, a counter substrate 70, and an adhesive layer 80 configured to bond the substrate 10 and the counter substrate 70. The substrate 10 includes a circuit board 12, a reflective layer 210, a resonance adjustment layer 22, an element portion 2, a protective layer 4, and a color filter 6. The element portion 2 includes a plurality of the organic EL elements 20. The display panel 1 is a top-emission type in which light generated from the organic EL element 20 is transmitted through the counter substrate 70 and emitted. The reflective layer 210 includes a plurality of reflective portions 21. Further, in the present embodiment, an optical resonator that resonates light in a predetermined wavelength region is configured between the reflective portion 21 and the common electrode 25.

The circuit board 12 includes a base 121 and a wiring layer 120 arranged on the base 121. The base 121 is made of, for example, silicon, glass, resin, ceramic, or the like. Note that, the display panel 1 is a top-emission type, and thus the base 121 may or may not have translucency.

The wiring layer 120 includes the circuit 300 and a plurality of insulating films 122, 123, and 124. Note that, FIG. 5 does not illustrate all of the various wirings and the like constituting the circuit 300.

The insulating film 122 is arranged on the base 121. A semiconductor layer 320 included in the driving transistor 32 is arranged on the insulating film 121. The semiconductor layer 320 has a channel 32c, a drain 32d, and a source 32s. Note that, when the base 121 is silicon, the semiconductor layer 320 may be formed by implanting ions into the base 121. Further, the insulating film 123 is arranged on the insulating film 122 to cover the semiconductor layer 320. A gate electrode 32g of the driving transistor 32 is arranged on the insulating film 123. The gate electrode 32g overlaps the channel 32c in plan view. The insulating film 124 is arranged on the insulating film 123 to cover the gate electrode 32g. Relay electrodes 321 and 322 are arranged on the insulating film 124. The relay electrode 321 is electrically coupled to the drain 32d via a through electrode 3211 arranged in a contact hole that penetrates the insulating film 123. On the other hand, the relay electrode 322 is electrically coupled to the source 32s via a through electrode 3221 arranged in the contact hole that penetrates the insulating film 123. Note that, although not illustrated in FIG. 5, the relay electrode 322 is coupled to the power supplying line 15.

Examples of a constituent material of the insulating films 122, 123, and 124 include silicon-based inorganic materials such as silicon oxide, silicon nitride, and silicon oxynitride. Further, examples of a constituent material of various wirings and the like configuring the circuit 300 include metal, metal silicide, and a metal compound.

The reflective layer 210 including the plurality of reflective portions 21 is arranged on the insulating film 124. The reflective portion 21 has light reflectivity, and reflects light generated from the organic layer 24 toward the organic layer 24 side. The reflective portion 21 is, for example, a laminate in which a layer including titanium (Ti) and a layer including an Al—Cu alloy are laminated in this order on the insulating film 124. Further, one reflective portion 21 is provided in one sub-pixel P0. The plurality of reflective portions 21 are arranged in a matrix in plan view.

The resonance adjustment layer 22 is arranged on the insulating film 124 to cover the reflective layer 210. The resonance adjustment layer 22 is a layer configured to adjust an optical distance L0 that is an optical distance between the reflective portion 21 and the common electrode 25. As illustrated in the drawing, a thickness of the resonance adjustment layer 22 is equal in the sub-pixels PB, PG, and PR, but actually varies for each light emission color. By varying the optical distance L0 for each of the sub-pixels PB, PG, and PR, light of a specific resonance wavelength is extracted. The optical distance L0 in the sub-pixel PB is set so as to correspond to light in a blue wavelength region. The optical distance L0 in the sub-pixel PG is set so as to correspond to light in a green wavelength region. The optical distance L0 in the sub-pixel PR is set so as to correspond to light in a red wavelength region. Note that, the optical distance L0 may be adjusted by adjusting the thickness of the pixel electrode 23 instead of the thickness of the resonance adjustment layer 22. Further, the optical distance L0 may be adjusted by adjusting both the thickness of the resonance adjustment layer 22 and the thickness of the pixel electrode 23.

Examples of a constituent material of the resonance adjustment layer 22 include silicon-based inorganic materials having translucency and insulating properties. Specifically, examples thereof include silicon oxide, silicon nitride, and the like.

The plurality of pixel electrodes 23 and a partition 26 surrounding each of the pixel electrodes 23 in plan view are arranged on the resonance adjustment layer 22. The pixel electrode 23 is provided for each sub-pixel P0. The pixel electrode 23 is electrically coupled to the relay electrode 321 via a through electrode 3212 arranged in a contact hole that penetrates the resonance adjustment layer 22. Further, the pixel electrodes 23 are insulated from each other by the partition 26. Note that, the partition 26 has a lattice shape in plan view, for example. Further, the pixel circuit 30 described above overlaps the partition 26 in plan view to prevent malfunction due to light.

The constituent material of the pixel electrode 23 is a transparent conductive material such as Indium Tin Oxide (ITO) or Indium Xinc Oxide (IZO). Further, the constituent material of the partition 26 is an insulating material, and specifically, is an inorganic material such as an acrylic-based photosensitive resin or silicon oxide. For example, the partition 26 is made of a resin material having a light shielding property.

The organic layer 24 is arranged on the pixel electrode 23. The organic layer 24 includes at least a light-emitting layer 240 containing a light-emitting material that emits light when supplied with current. In the present embodiment, the light-emitting layer 240 has a configuration including lamination of a layer containing a blue light-emitting material, a layer containing a green light-emitting material, and a layer containing a red light-emitting material. Blue light is generated from the layer containing the blue light-emitting material, green light is generated from the layer containing the green light-emitting material, and red light is generated from the layer containing the red light-emitting material. Therefore, it can be said that white light is generated from the light-emitting layer 240. Further, in the present embodiment, in addition to the light-emitting layer 240, the organic layer 24 includes a hole injection layer (HIL), a hole transportation layer (HTL), an electron injection layer (EIL), and an electron transportation layer (ETL). In the organic layer 24, holes injected from the hole injection layer and electrons transported from the electron transportation layer are recombined in the light-emitting layer 240. Note that any configuration may be used for the configuration of the organic layer 24, and any of the layers described above may be omitted from the organic layer 24, or any layer may be further added.

The common electrode 25 is arranged on the organic layer 24. The common electrode 25 has translucency and light reflectivity. The common electrode 25 is formed continuously across the plurality of sub-pixels P0. The common electrode 25 is made of, for example, magnesium and silver, or an alloy including these materials as main components, and the like.

As described above, in the present embodiment, light in a predetermined wavelength region of light generated in the organic layer 24 resonates between the reflective portion 21 and the common electrode 25. When a peak wavelength of a spectrum of the light in the predetermined wavelength region is represented by λ0, the following relationship [1] holds true. Φ (radian) represents a sum of phase shifts that occur during transmission and reflection between the reflective portion 21 and the common electrode 25.

$$\{(2 \times L0)/\lambda 0 + \Phi\}/(2\pi) = m0 \, (m0 \text{ is an integer}) \quad [1]$$

The optical distance L0 is set such that a peak wavelength of light in a wavelength region to be extracted is λ0. Then, by setting the thickness of each of the resonance adjustment layer 22 and the pixel electrode 23 according to the optical distance L0, the light in the predetermined wavelength region to be extracted is resonated and enhanced. The light in the predetermined wavelength region is enhanced by adjusting the optical distance L0 in accordance with the light in the wavelength region to be extracted, and the light can be increased in intensity and a spectrum of the light can be narrowed.

The protective layer 4 is arranged on the common electrode 25 to protect the organic EL element 20 and the like. The protective layer 4 may seal the element portion 2 and protect the organic layer 24 from moisture, oxygen, or the like in the atmosphere. In other words, the protective layer 4 has gas barrier properties. Thus, reliability of the display panel 1 can be increased as compared to a case where the protective layer 4 is not provided.

The protective layer 4 has translucency. The protective layer 4 includes a first layer 41 arranged on the common electrode 25, a second layer 42 arranged on the first layer 41, and a third layer 43 arranged on the second layer. Examples of the constituent material of the first layer 41 and the third layer 43 include, for example, silicon-based inorganic materials such as silicon oxynitride and silicon nitride. When the first layer 41 is mainly composed of a silicon-based inorganic material containing nitrogen, the gas barrier properties of the first layer 41 can be increased further than those when the first layer 41 is mainly composed of silicon oxide. Note that, the same applies to the third layer 43.

Examples of the constituent material of the second layer 42 include, for example, silicon oxide such as silicon dioxide, and an inorganic material such as aluminum oxide. Even when a defect such as a pinhole occurs in the first layer 41 during manufacturing, the defect can be complemented by providing the second layer 42. Therefore, it is possible to particularly effectively suppress transmission of moisture and the like in the atmosphere to the organic layer 24 with, as a path, a defect such as a pinhole that may occur in the first layer 41. Therefore, by providing the second layer 42, the sealing properties of the element portion 2 caused by the protective layer 4 can be improved compared to a case where the second layer 42 is not provided.

The thickness of the first layer 41 is not particularly limited, but is, for example, not less than 50 nm and not greater than 500 nm. The thickness of the second layer 42 is not particularly limited, but is, for example, not less than 10 nm and not greater than 100 nm. The thickness D3 of the third layer 43 is not particularly limited, but is, for example, not less than 200 nm or not greater than 1000 nm.

Note that, materials other than the constituent materials described above may be included in the first layer 41, the second layer 42, and the third layer 43 to the extent that the function of each layer is not deteriorated. Further, the protective layer 4 is not limited to the configuration including the first layer 41, the second layer 42, and the third layer 43, and may further include other layers. Further, any two or more of the first layer 41, the second layer 42, and the third layer 43 may be omitted.

The color filter 6 is arranged on the protective layer 4. The color filter 6 corresponds to light in a predetermined wavelength region, and selectively transmits the light in the predetermined wavelength region. The color filter 6 includes a colored layer 61B corresponding to the sub-pixel PB, a colored layer 61G corresponding to the sub-pixel PG, and a colored layer 61R corresponding to the sub-pixel PR. The colored layer 61B, the colored layer 61G, and the colored layer 61R are aligned along the x-y plane.

The color filter 6 is made of a resin material containing a colored material of each color. Specifically, for example, the color filter 6 is made of an acrylic photosensitive resin material containing a colored material. Note that the display panel 1 may have a configuration in which the color filter 6 is omitted. However, color purity of light emitted from the display panel 1 can be improved by providing the color filter 6 in the display panel 1 as compared to a case where the color filter 6 is not provided. Further, the thickness of each layer included in the color filter 6 is not particularly limited, but is, for example, not less than 1.0 μm and not greater than 2.0 μm.

Note that the color filter 6 may have a so-called black matrix, which is located between the respective colors in plan view and which overlaps the partition 26 in plan view.

The adhesive layer 80 having translucency is arranged on the color filter 6. Examples of constituent material of the bonding material 51 include, for example, a transparent resin material such as an epoxy resin and an acrylic resin. In particular, by using a photosensitive resin, the manufacturing time of the adhesive layer 80 can be reduced compared with a case where a thermosetting resin is used. In addition, damage of the organic EL element 20 due to heat can be reduced. Note that the adhesive layer 80 may be made of any material as long as the counter substrate 70 can be bonded to the substrate 10 and has translucency. Further, the thickness of the adhesive layer 80 is not particularly limited, but is, for example, not less than 10 μm and not greater than 100 μm.

The counter substrate 70 is arranged on the color filter 6 via the adhesive layer 80. The counter substrate 70 is a cover that protects the organic EL element 20. The counter substrate 70 has translucency and is made of, for example, a glass substrate or a quartz substrate. Further, the thickness of the counter substrate 70 is not particularly limited, but is, for example, not less than 0.3 mm and not greater than 1.5 mm.

Figure 6:
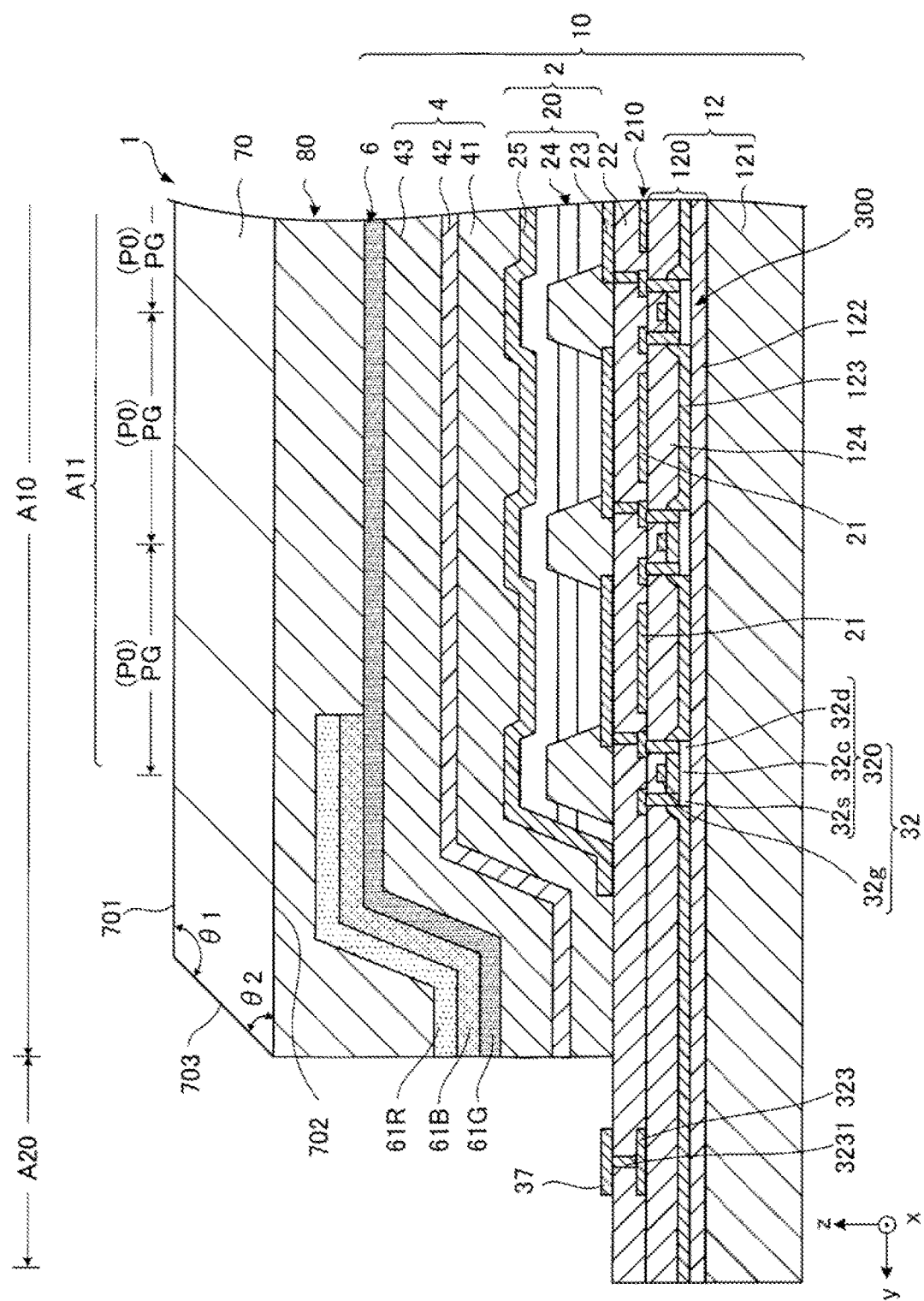
FIG. 6 is a partial cross-sectional view of the display panel according to the first embodiment.

FIG. 6 is a partial cross-sectional view of the display panel 1 according to the first embodiment, and is a cross-sectional view of the display panel 1 taken along a B-B line in FIG. 2. The terminal 37 of the display panel 1 and a surrounding structure thereof will be described with reference to FIG. 6.

As illustrated in FIG. 6, the terminal 37 is arranged on the resonance adjustment layer 22. The terminal 37 is electrically coupled to a relay electrode 323 via a through electrode 3231 arranged in a contact hole that penetrates the resonance adjustment layer 22. Although not illustrated in detail, the relay electrode 323 is electrically coupled to a wiring configured to electrically couple the terminal 37 and the circuit 300 provided in the wiring layer 120. Further, the protective layer 4, the color filter 6, the adhesive layer 80, and the counter substrate 70 are not arranged in the terminal region A20 but arranged in the circuit region A10 so that the terminal 37 is exposed.

The color filter 6 includes a laminate in which the colored layer 61G, the colored layer 61B, and the colored layer 61R are laminated in this order from the protective layer 4 side. The laminate is arranged between the terminal region A20 and the display region A11 in plan view. The laminate is provided to prevent reflected light and prevent the influence of stray light.

Furthermore, the counter substrate 70 described above is a flat plate shaped member. The outer surface of the counter substrate 70 includes a first plate surface 701 located on the opposite side to the substrate 10, a second plate surface 702 located on the substrate 10 side, and a side surface 703 that connects the first plate surface 701 and the second plate surface 702.

Figure 7:
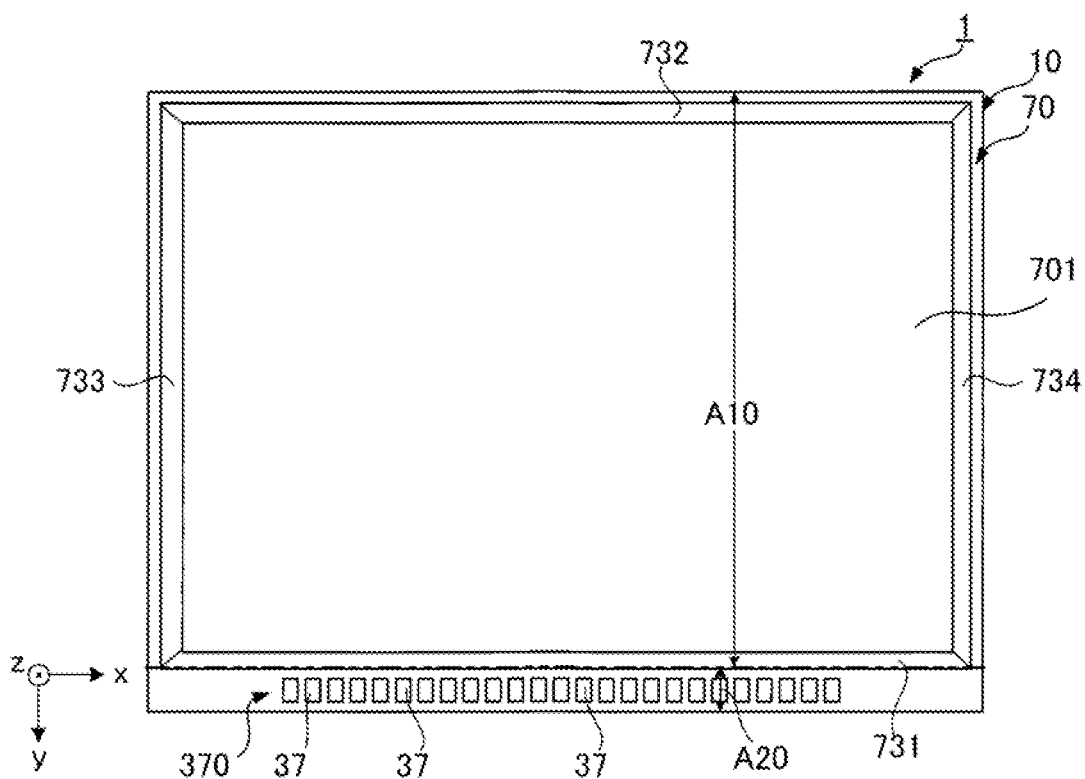
FIG. 7 is a plan view of the display panel according to the first embodiment.

FIG. 7 is a plan view of the display panel 1 according to the first embodiment. As illustrated in FIG. 7, the counter substrate 70 has a square shape in plan view. The side surface 703 of the counter substrate 70 includes, as "inclined surfaces", a first inclined surface 731, a second inclined surface 732, a third inclined surface 733, and a fourth inclined surface 734. The first inclined surface 731 and the second inclined surface 732 extend along the +x direction, and the third inclined surface 733 and the fourth inclined surface 734 extend along the +y direction. Further, the first inclined surface 731 connects one end of the third inclined surface 733 and one end of the fourth inclined surface 734. The second inclined surface 732 connects the other end of the third inclined surface 733 and the other end of the fourth inclined surface 734.

Among the first inclined surface 731, the second inclined surface 732, the third inclined surface 733, and the fourth inclined surface 734, the first inclined surface 731 corresponds to the "inclined surface" located closest to the terminal group 370. The first inclined surface 731, the second inclined surface 732, the third inclined surface 733, and the fourth inclined surface 734 are respectively inclined with respect to the first plate surface 701. These are inclined in a direction in which the first plate surface 701 becomes smaller than the second plate surface 702. In the present embodiment, as illustrated in FIG. 6, an angle θ1 between the first inclined surface 731 and the first plate surface 701 is greater than an angle θ2 between the first inclined surface 731 and the second plate surface 702. The same applies to the relationship between the angle θ1 and the angle θ2 for the second inclined surface 732, the third inclined surface 733, and the fourth inclined surface 734.

As described above, the electro-optical device 100 includes the substrate 10, the counter substrate 70, and the protective layer 4. The substrate 10 includes the circuit board 12 and the protective layer 4. A plurality of organic EL elements 20, a circuit 300 electrically coupled to the plurality of organic EL elements 20, and a terminal 37 electrically coupled to the circuit 300 are provided in the circuit board 12. The protective layer 4 is arranged between the plurality of organic EL elements 20 and the counter substrate 70. Further, the counter substrate 70 has a rectangular shape in plan view, and is arranged to overlap the plurality of organic EL elements 20 and the circuit 300 in plan view. Furthermore, the terminals 37 are located outside the counter substrate 70 in plan view. That is, the terminals 37 do not overlap the counter substrate 70 in plan view.

The counter substrate 70 does not overlap the terminals 37 in plan view, thus electrical coupling between the terminals 37 and the FPC substrate 95 can be suitably performed, and thus, the electro-optical device 100 having high connection reliability can be provided.

In addition, as described above, the counter substrate 70 includes a first plate surface 701 on the opposite side of the counter substrate 70 to the protective layer 4, a second plate surface 702 on the protective layer 4 side of the counter substrate 70, and a side surface 703 that connects the first plate surface 701 and the second plate surface 702. The side surface 703 includes four "faces". Specifically, the side surface 703 includes a first inclined surface 731, a second inclined surface 732, a third inclined surface 733, and a fourth inclined surface 734. The first inclined surface 731 corresponds to an "inclined surface" that is inclined with respect to the first plate surface 701 in a direction such that the area of the first plate surface 701 becomes smaller than the area of the second plate surface 702. By providing the first inclined surface 731, compared to a case where the first inclined surface 731 is not inclined and is orthogonal to the first plate surface 701, the terminals 37 can be easily exposed by a method for manufacturing the electro-optical device 100 described below. Note that the manufacturing method will be described in detail below.

In addition, in the present embodiment, the second inclined surface 732, the third inclined surface 733, and the fourth inclined surface 734 are also inclined in the same manner as the first inclined surface 731, thus, the protective layer removal step S15 in a method for manufacturing the electro-optical device 100 described below can be performed efficiently and with high definition. Note that the inclination direction or inclination angle of each of the second inclined surface 732, the third inclined surface 733, and the fourth inclined surface 734 may be different from that of the first inclined surface 731.

1A-4. Method for Manufacturing Electro-Optical Device 100

Figure 8:
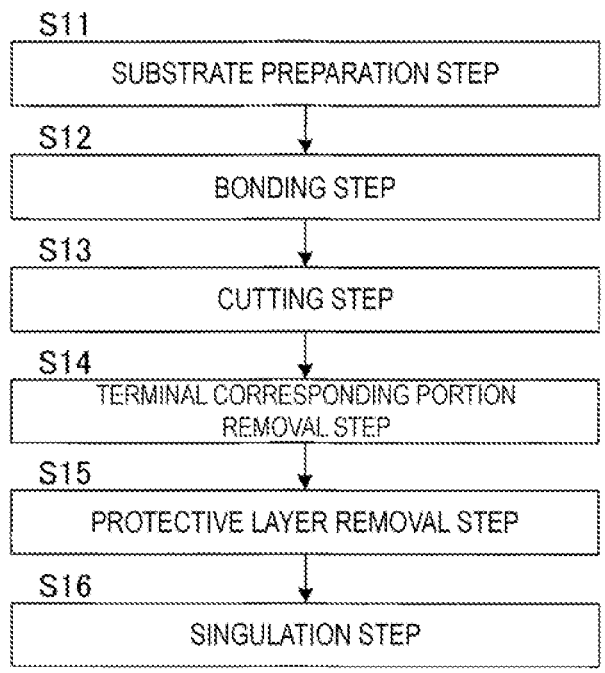
FIG. 8 is a flowchart illustrating a method for manufacturing the electro-optical device according to the first embodiment.

Next, a method for manufacturing an electro-optical device included in the electro-optical device 100 will be described. FIG. 8 is a flowchart illustrating a method for manufacturing the display panel 1 according to the first embodiment. As illustrated in FIG. 8, the manufacturing method of the display panel 1 includes a substrate preparation step S11, a bonding step S12, a cutting step S13, a terminal corresponding portion removal step S14, a protective layer removal step S15, and a singulation step S16. By performing these steps in order, a plurality of the display panels 1 are manufactured. Further, by housing the manufactured display panel 1 in the case 90, the electro-optical device 100 according to the present embodiment can be obtained.

1A-4a. Substrate Preparation Step S11

Figure 9:
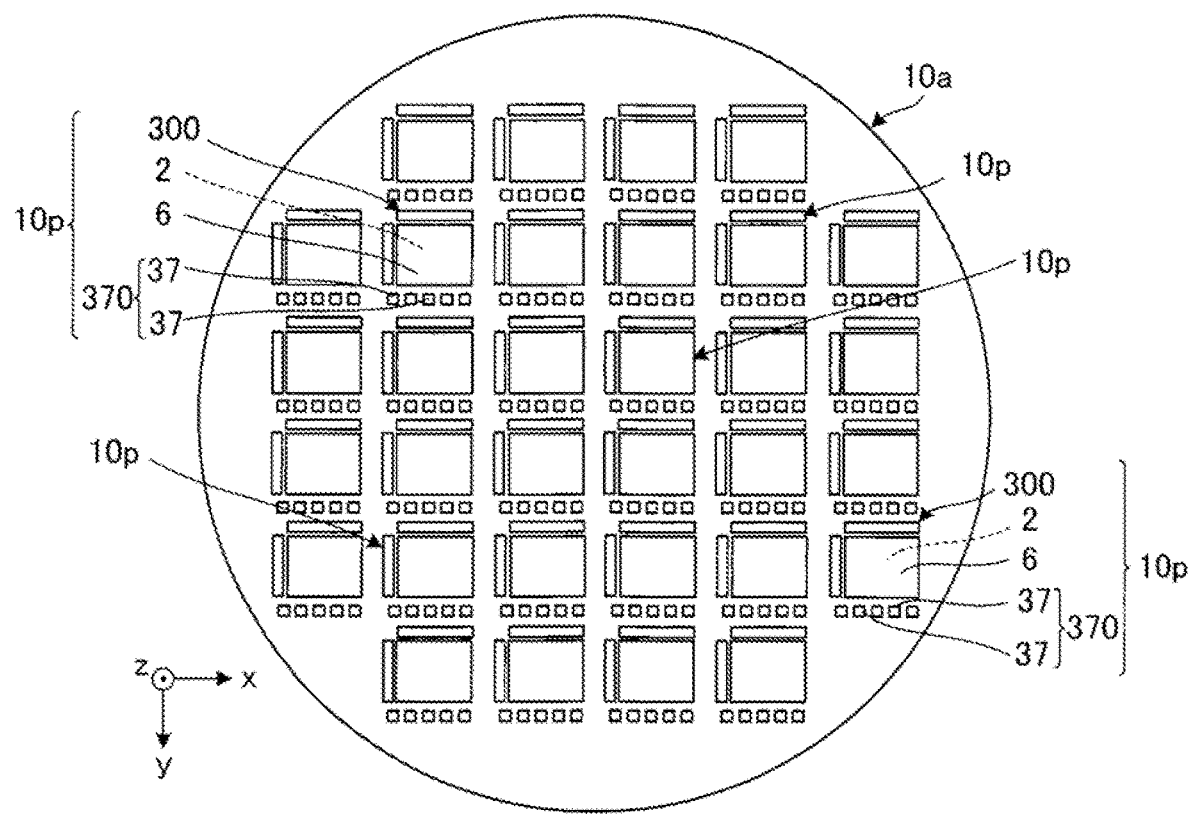
FIG. 9 is a plan view illustrating a substrate preparation step according to the first embodiment.

FIG. 9 is a plan view illustrating the substrate preparation step S11 according to the first embodiment. First, a substrate 10a illustrated in FIG. 9 is prepared. The substrate 10a is a mother substrate that ultimately becomes a plurality of substrates 10 through the singulation step S16. The substrate 10a includes a plurality of pattern portions 10p. One pattern portion 10p eventually becomes one substrate 10. The plurality of pattern portions 10p aligned along the +x direction are arranged such that the plurality of terminal groups 370 are aligned in a row. Further, the plurality of pattern portions 10p are arranged separated from each other along the +x direction.

Figure 10:
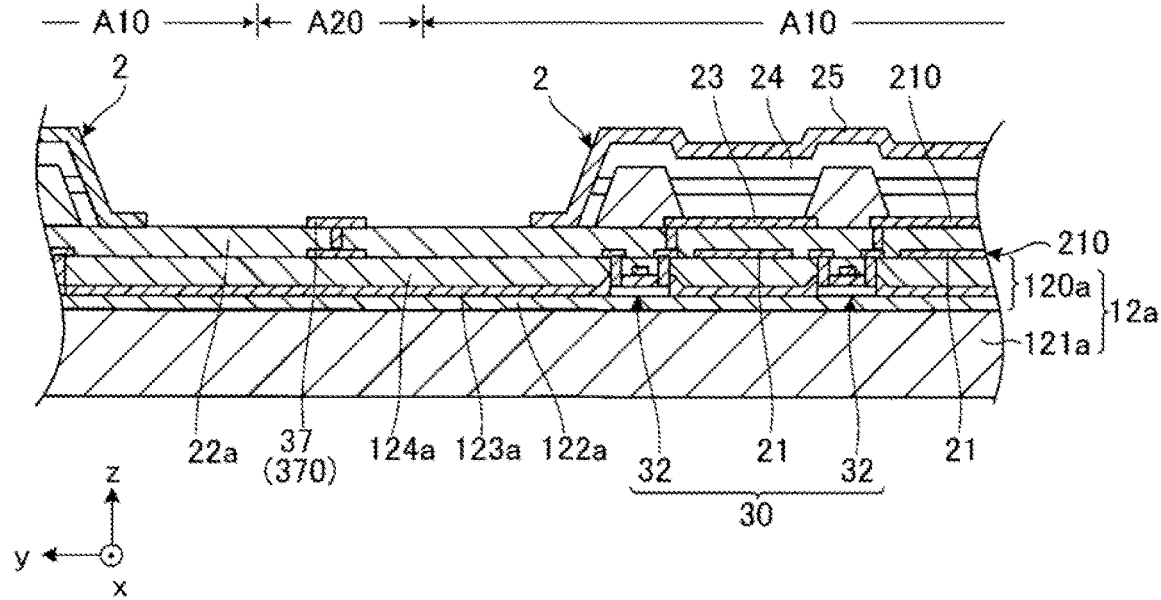
FIG. 10 is an enlarged cross-sectional view illustrating the substrate preparation step according to the first embodiment.
Figure 11:
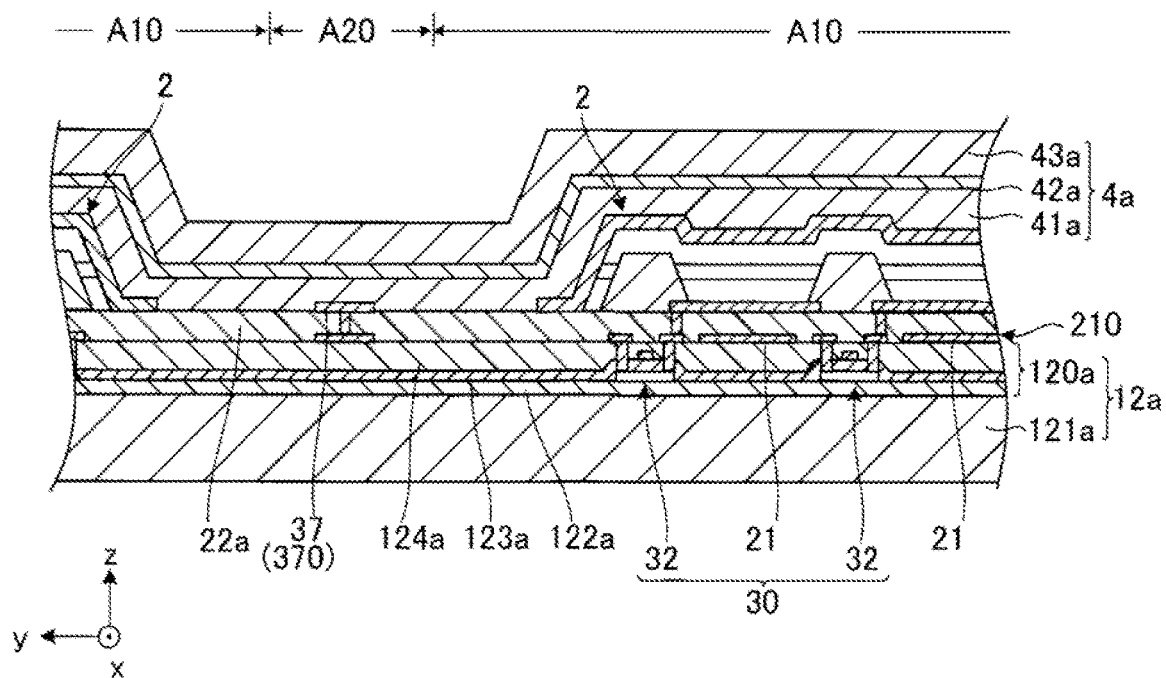
FIG. 11 is an enlarged cross-sectional view illustrating the substrate preparation step according to the first embodiment.
Figure 12:
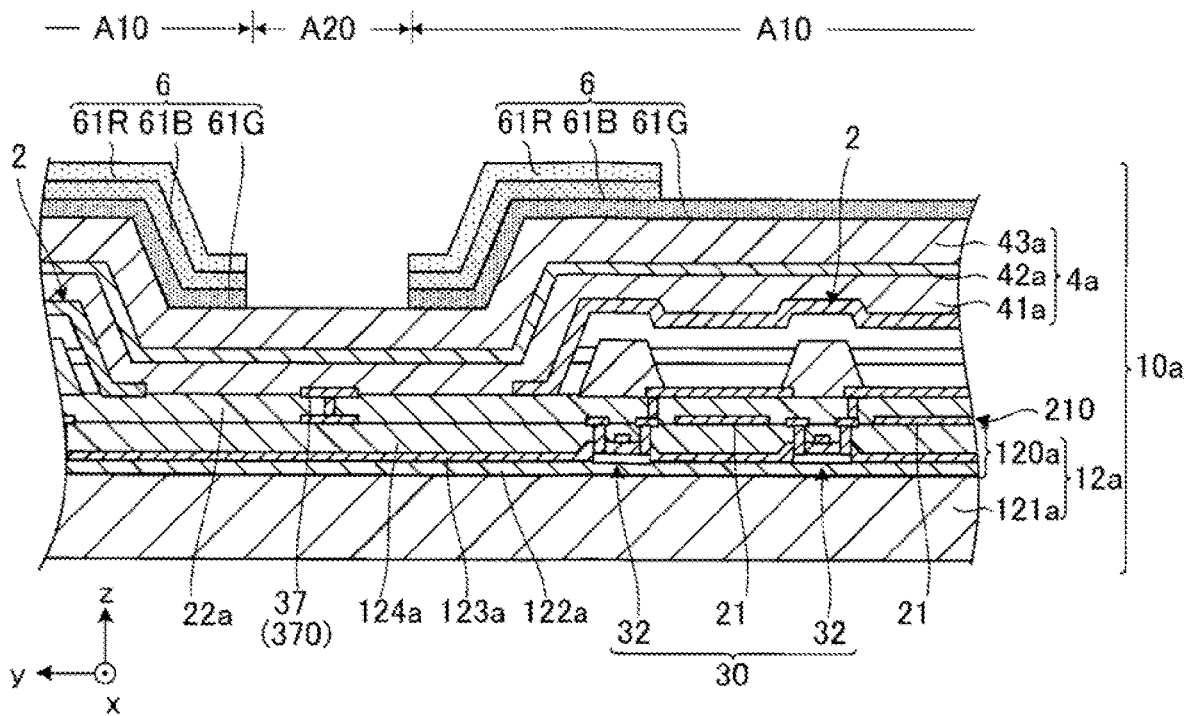
FIG. 12 is an enlarged cross-sectional view illustrating the substrate preparation step according to the first embodiment.
Figure 13:
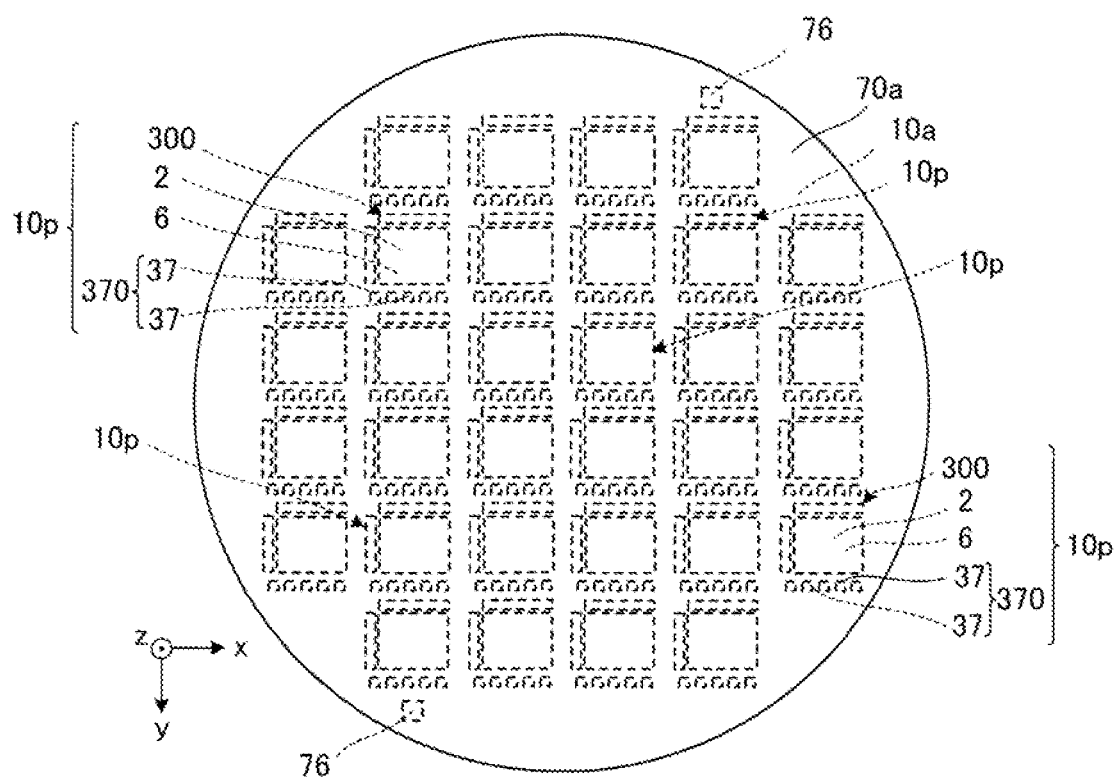
FIG. 13 is a plan view illustrating a bonding step according to the first embodiment.

FIG. 10, FIG. 11, and FIG. 12 are enlarged cross-sectional views illustrating the substrate preparation step S11 according to the first embodiment. For example, the substrate 10a is prepared by a forming method as follows. First, as illustrated in FIG. 10, a circuit board 12a, the plurality of reflective layers 210, a resonance adjustment layer 22a, and the plurality of element portions 2 and the plurality of terminal groups 370 are sequentially formed. Next, as illustrated in FIG. 11, a protective layer 4a covering the plurality of terminal groups 370 in plan view is formed. Next, as illustrated in FIG. 12, the plurality of color filters 6 are formed. As a result, the substrate 10a is prepared. The substrate 10a includes the circuit board 12a, the plurality of reflective layers 210, the resonance adjustment layer 22a, the plurality of element portions 2, the plurality of terminal groups 370, the protective layer 4a, and the plurality of color filters 6. Note that, the element portion 2, the reflective layer 210, the terminal group 370, and the color filter 6 are provided for each of the pattern portions 10p. The circuit board 12a, the resonance adjustment layer 22a, and the protective layer 4a are common in the plurality of pattern portions 10p. Finally, the circuit board 12a becomes a plurality of circuit boards 12. The resonance adjustment layer 22a becomes a plurality of resonance adjustment layers 22. The protective layer 4a becomes a plurality of protective layers 4. Further, the circuit 300 included in the circuit board 12a is provided for each of the pattern portions 10p as illustrated in FIG. 13.

Specifically, as illustrated in FIG. 10, a wiring layer 120a is formed on a substrate 121a formed by, for example, a silicon plate or the like. The wiring layer 120a includes an insulating film 122a, an insulating film 123a, and an insulating film 124a. The insulating film 122a, the insulating film 123a, and the insulating film 124a are formed commonly across the plurality of pattern portions 10p. In addition, in the wiring layer 120a, a pixel circuit 30 including a drive transistor 32 and the like is formed for each of the pattern portions 10p. In addition, in the insulating layer 123a, a reflective layer 210 is formed for each of the pattern portions 10p. Further, the resonance adjustment layer 22a is formed on the insulating film 124a. The element portion 2 and the terminal group 370 are formed on the resonance adjustment layer 22a for each of the pattern portions 10p. The element portion 2 includes the plurality of pixel electrodes 23, the organic layer 24, and the common electrode 25.

The circuit board 12a, the plurality of reflective layers 210, the resonance adjustment layer 22a, and the plurality of element portions 2 can be formed by using known film-forming technology, hole filling technology, flattening technology, and the like.

The protective layer 4a illustrated in FIG. 11 is formed, for example, as follows. First, a first layer 41a composed of a silicon nitride film is formed across a plurality of common electrodes 25 by a Chemical Vapor Deposition (CVD) method using a plasma. Next, a second layer 42a composed of a silicon oxide film is formed on the first layer 41a by an Atomic Layer Deposition (ALD) method using 02 plasma. Next, a third layer 43a composed of a silicon nitride film is formed on the second layer 42a by CVD method using a plasma. In this way, the protective layer 4a including the first layer 41a, the second layer 42a, and the third layer 43a can be prepared. Note that the method for forming each layer of the protective layer 4a may be a sputtering method, an ion plating method, or the like. Furthermore, the constituent material of the protective layer 4a is not limited to the material described above, but may be an inorganic material having translucency in order to improve gas barrier properties and translucency.

The plurality of color filters 6 illustrated in FIG. 12 are formed, for example, as follows. First, a plurality of colored layers 61G are formed on the protective layer 4a, then, a plurality of colored layers 61B are formed, and then, a plurality of colored layers 61R are formed. Specifically, for example, a green resin layer is formed by applying a photosensitive resin containing a green color material to the protective layer 4a by a spin coating method, and drying the photosensitive resin. Then, portions of the green resin layer that form the plurality of colored layers 61G are exposed, and unexposed portions of the resin layer are removed by an alkaline developer or the like. Then, the plurality of colored layers 61G is formed by curing the green resin layer. Note that the plurality of colored layers 61B and the plurality of colored layers 61R are formed by the same method as the formation of the plurality of colored layers 61G.

1A-4b. Bonding Step S12

Figure 17:
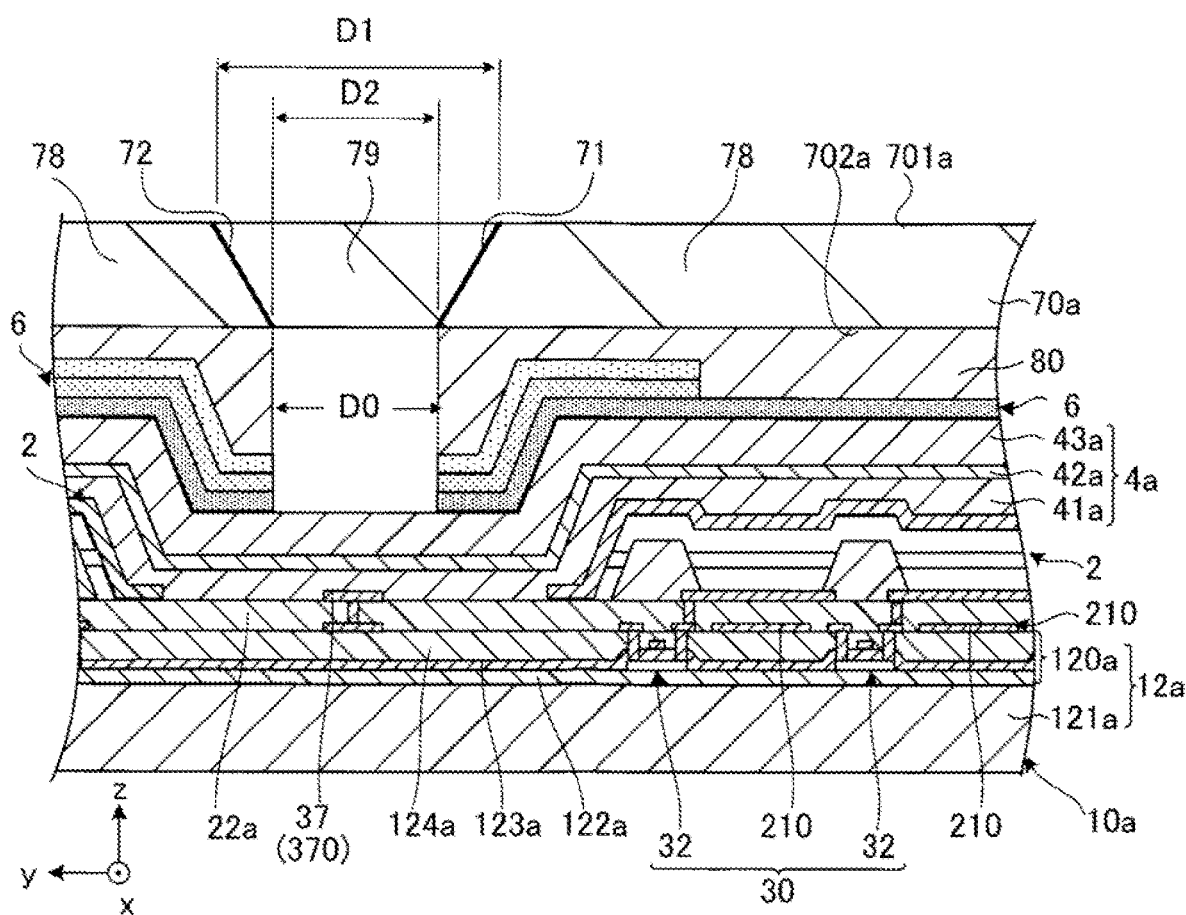
FIG. 17 is an enlarged cross-sectional view illustrating the cutting step according to the first embodiment.

FIG. 17 is a plan view illustrating the bonding step S12 according to the first embodiment. In the bonding step S12, as illustrated in FIG. 13, for example, a counter substrate 70a having a planar area equivalent to that of the substrate 10a is attached to the substrate 10a. Therefore, the counter substrate 70a overlaps the plurality of pattern portions 10p in plan view. Each of the pattern portions 10p includes an element portion 2, a circuit 300, a color filter 6, and a terminal group 370. Thus, the plurality of element portions 2, the plurality of circuits 300, the plurality of color filters 6, and the plurality of terminals 37 are covered by the counter substrate 70a. Here, when viewed in plan view from the −z direction, the counter substrate 70a is arranged to overlap the plurality of pattern portions 10p, and overlap the plurality of element portions 2, the plurality of pixel circuits 30, the plurality of color filters 6, and the plurality of terminal groups 370. In addition, in plan view, the counter substrate 70a is arranged to overlap the organic EL element 20, and to overlap the pixel electrode 23. In plan view, the counter substrate 70a may be arranged to overlap the scanning line drive circuit 361 and the data line drive circuit 362.

Figure 14:
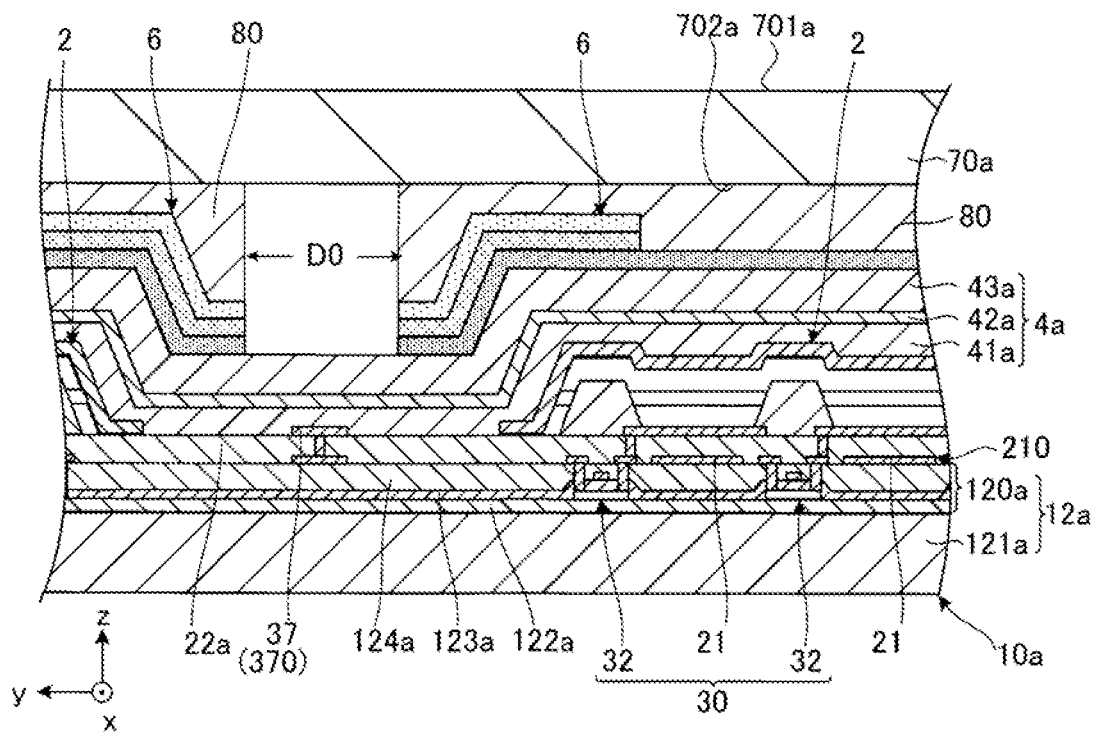
FIG. 14 is an enlarged cross-sectional view illustrating the bonding step according to the first embodiment.

FIG. 14 is an enlarged cross-sectional view illustrating the bonding step S12 according to the first embodiment. Specifically, as illustrated in FIG. 14, in the bonding step S12, the counter substrate 70a is bonded to the substrate 10a by a plurality of adhesive layers 80. The outer surface of the counter substrate 70a includes a first plate surface 701a located on the opposite side to the substrate 10a, and a second plate surface 702a located on the substrate 10a side. The second plate surface 702a is bonded to the substrate 10a by the plurality of adhesive layers 80. The adhesive layer 80 is provided for each of the plurality of pattern portions 10p. For example, a transparent photosensitive resin material is applied to each of the plurality of color filters 6, and the counter substrate 70a is arranged and pressed on the applied resin material. The counter substrate 70a is formed of a glass substrate or the like. At this time, the amount of the resin material or the degree of pressure may be adjusted so that the terminal 37 is not covered by the pressed resin material. Thus, the adhesive layer 80 is provided so as not to cover the terminal 37. Next, the photosensitive resin is cured by being irradiated with light through the counter substrate 70a. By the curing, the plurality of adhesive layers 80 formed of a cured product of the resin material is obtained. Further, the counter substrate 70a is bonded to the substrate 10a by the plurality of adhesive layers 80.

Further, two of the adhesive layers 80 adjacent to each other along the +y direction are formed separated from each other at a gap D0. Note that, although not illustrated, the adhesive layers 80 adjacent to each other along the +x direction are also separated from each other.

As illustrated in FIG. 13, a plurality of alignment marks 76 are formed on the counter substrate 70a. Although not illustrated in FIG. 14, for example, the alignment marks 76 are formed on the second plate surface 702a, that is, on a surface of the counter substrate 70a on the adhesive layer 80 side. The alignment mark 76 is used for positioning the irradiation position of the laser beam LL used in the subsequent cutting step S13 with respect to the counter substrate 70a. Note that the arrangement of the alignment marks 76 is not limited to this, for example, the alignment marks 76 may be formed on the protective layer 4a.

1A-4c. Cutting Step S13

Figure 15:
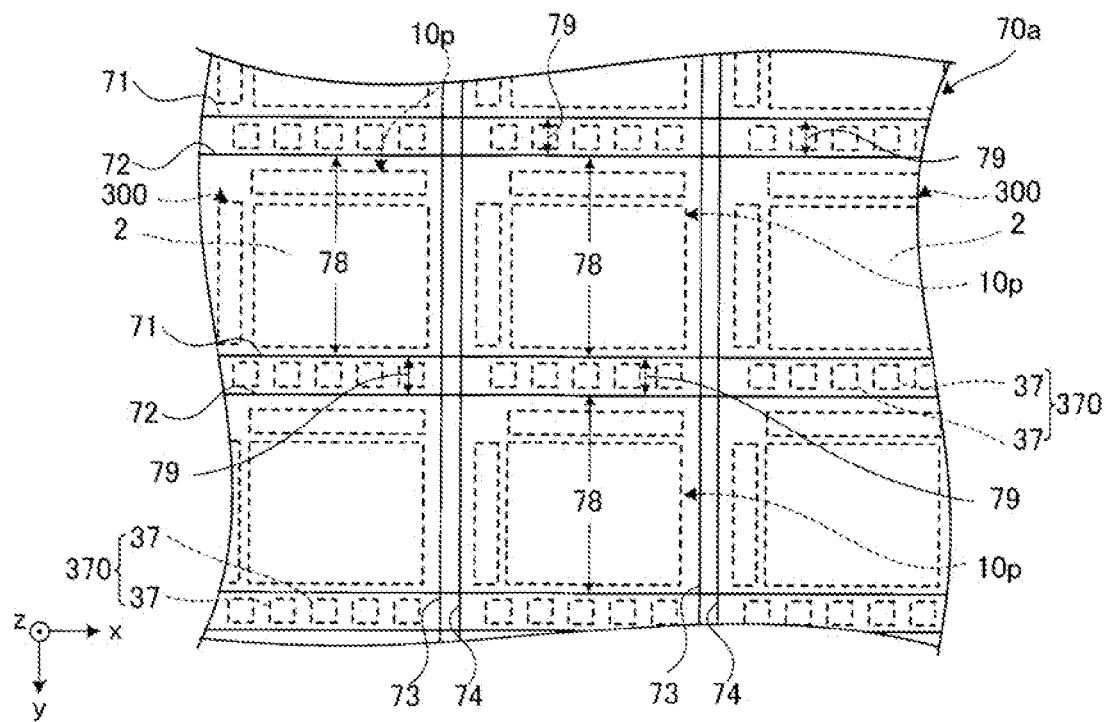
FIG. 15 is an enlarged plan view illustrating a cutting step according to the first embodiment.
Figure 16:
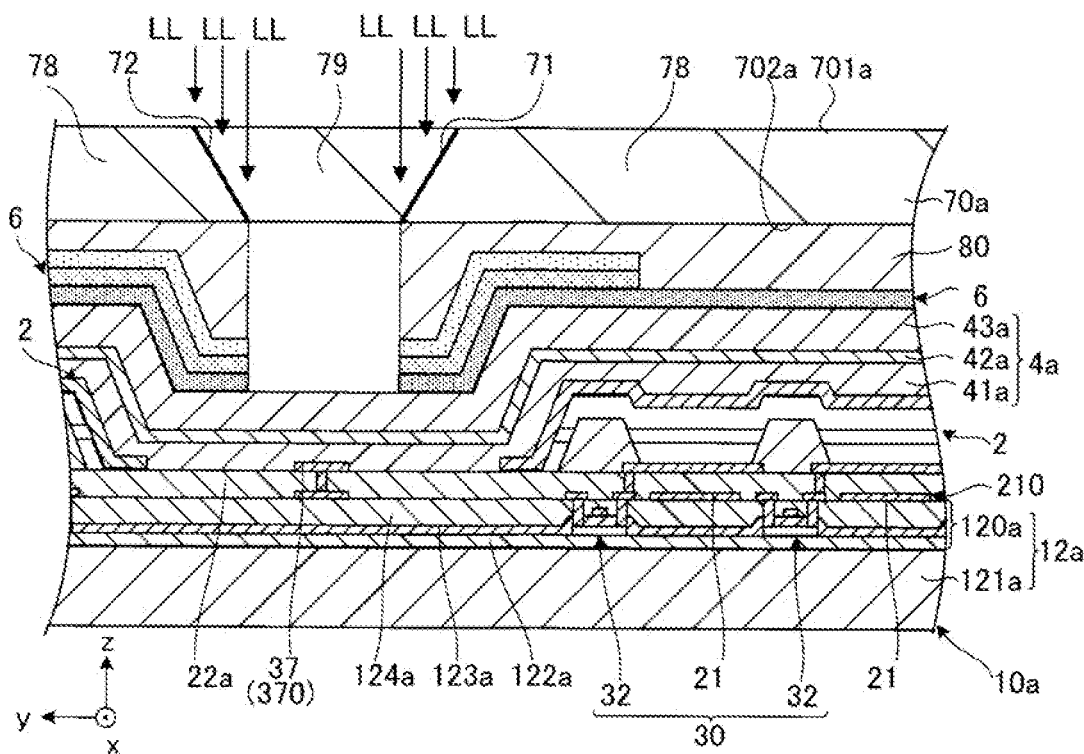
FIG. 16 is an enlarged cross-sectional view illustrating the cutting step according to the first embodiment.

FIG. 15 is an enlarged plan view illustrating the cutting step S13 according to the first embodiment. FIG. 16 and FIG. 17 are enlarged cross-sectional views illustrating the cutting step S13 according to the first embodiment.

In the cutting step S13, the counter substrate 70a is cut by irradiation of the laser beam LL. Specifically, by irradiating with the laser beam LL, a plurality of first surfaces 71 and a plurality of second surfaces 72 are formed on the counter substrate 70a as illustrated in FIG. 15. The plurality of first surfaces 71 extend in the +x direction and are line shaped in plan view. The plurality of second surfaces 72 extend in the +x direction in plan view and are line shaped in plan view. Further, by irradiation of the laser beam LL, a plurality of third surfaces 73 and a plurality of fourth surfaces 74 are formed on the counter substrate 70a. The plurality of third surfaces 73 extend in the +y direction and are line shaped in plan view. The plurality of fourth surfaces 74 extend in the +y direction and are line shaped in plan view.

The first surface 71 and the second surface 72 are formed to sandwich the plurality of terminal groups 370 aligned in a row in plan view. That is, the first surface 71 and the second surface 72 are formed on both sides of the plurality of terminal groups 370 aligned in a row. The first surface 71 is formed between the terminal group 370 and the element portion 2 in plan view. The first surface 71 may be formed between the terminal group 370 and the circuit 300 in plan view. The second surface 72 is formed between two adjacent pattern portions 10p in plan view. Further, the third surface 73 and the fourth surface 74 are formed separated from each other between two adjacent pattern portions 10p in plan view.

The laser beam LL is focused in a point shape and is irradiated so as to be scanned in a line shape. The laser beam LL is obtained by focusing, for example, a carbon dioxide laser or the like having a wavelength of 10.6 µm with an optical system. The laser beam LL is scanned along the +x direction so as to traverse from one end to the other end in the +x direction of the counter substrate 70a. This scanning forms the first surface 71 and the second surface 72. Additionally, the laser beam LL is scanned in the +y direction so as to traverse from one end to the other end in the +y direction of the counter substrate 70a. This scanning forms the third surface 73 and the fourth surface 74.

In addition, by forming the plurality of first surfaces 71, the plurality of second surfaces 72, the plurality of third surfaces 73, and the plurality of fourth surfaces 74, a plurality of circuit corresponding portions 78 and a plurality of terminal corresponding portions 79 are cut from the counter substrate 70a. In the present embodiment, the circuit corresponding portion 78 and the terminal corresponding portion 79 are provided for each pattern portion 10p. Each circuit corresponding portion 78 has a quadrangular shape in plan view, and includes a portion overlapping the element portion 2, the pixel circuit 30, and the color filter 6. Additionally, in plan view, the circuit corresponding portion 78 is arranged to overlap the organic EL element 20 and overlap the pixel electrode 23. In plan view, the circuit corresponding portion 78 may be arranged to overlap the scanning line drive circuit 361 and the data line drive circuit 362. Further, the terminal corresponding portion 79 is a portion corresponding to the terminal group 370. Each terminal corresponding portion 79 has a quadrangular shape in plan view, and includes a portion overlapping the terminal group 370. Note that, as illustrated in FIG. 2 described above, each circuit corresponding portion 78 overlaps the circuit region A10, and each terminal corresponding portion 79 overlaps the terminal region A20.

As illustrated in FIG. 16, the first surface 71 and the second surface 72 are connected to the first plate surface 701a on the +z axis side of the counter substrate 70a and the second plate surface 702a on the −z axis side of the counter substrate 70a. Note that, although not illustrated, the same applied to the third surface 73 and the fourth surface 74.

As illustrated in FIG. 16, the laser beam LL irradiates the counter substrate 70a such that each of the first surface 71 and the second surface 72 is inclined with respect to the first plate surface 701a. For example, the laser beam LL irradiates such that the irradiation depth goes from the shallowest position to the deepest position. That is, in the formation of the first surface 71, the scanning of the laser beam LL along the +x direction is repeated multiple times from the −y axis side toward the +y axis side. Further, in the formation of the second surface 72, the scanning of the laser beam LL along the +x direction is repeated multiple times from the +y axis side toward the −y axis side. Note that, although not illustrated, the same applied to the third surface 73 and the fourth surface 74.

By cutting the counter substrate 70a using the laser beam LL in this manner, the occurrence of cracks or chips in the substrate 10a can be reduced compared to a case where a cut surface is formed by a mechanical method. In addition, the radiation of the laser beam LL is performed under an optical control, thus precise positioning can be performed. Therefore, it is possible to suitably cope with miniaturization.

Note that, depending on the irradiation condition of the laser beam LL, the terminal corresponding portions 79 may not be completely cut from the counter substrate 70a in some cases, but the cutting of the terminal corresponding portions 79 from the counter substrate 70a includes a state where the terminal corresponding portions 79 are cut from the counter substrate 70a by applying a small force Px.

As illustrated in FIG. 17, in the terminal corresponding portion 79, a first distance D1 between the first surface 71 and the second surface 72 in the first plate surface 701a is greater than a second distance D2 between the first surface 71 and the second surface 72 in the second plate surface 702a. That is, the first surface 71 and the second surface 72 are each inclined with respect to the first plate surface 701a as described above, but are inclined in a direction in which the first distance D1 is greater than the second distance D2.

Further, the second distance D2 is equal to or less than the interval D0. When the adhesive layer 80 and the terminal region A20 are bonded to each other, it is difficult to remove the terminal region A20 in the next step, thus, the second distance D2 may be not greater than the interval D0.

1A-4d. Terminal Corresponding Portion Removal Step S14

Figure 18:
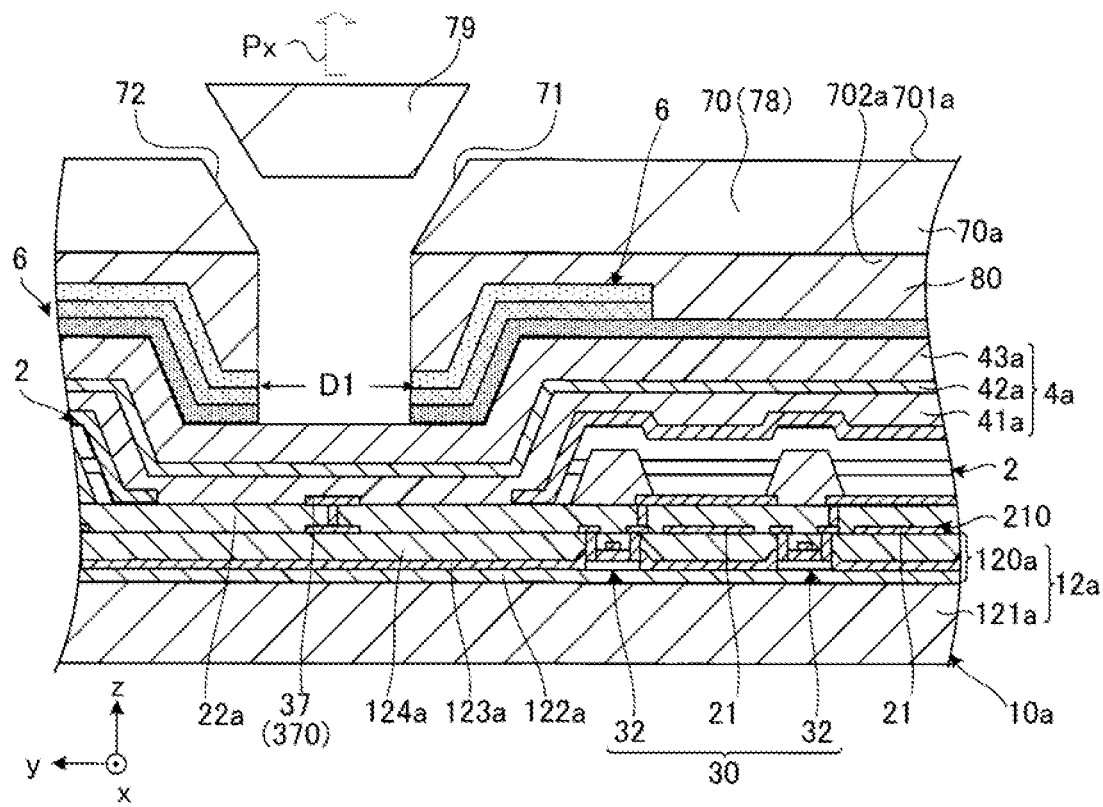
FIG. 18 is an enlarged cross-sectional view illustrating a terminal corresponding portion removal step according to the first embodiment.

FIG. 18 is an enlarged cross-sectional view illustrating the terminal corresponding portion removal step S14 according to the first embodiment. In the terminal corresponding portion removal step S14, the plurality of terminal corresponding portions 79 are removed. Note that, in step S14, in addition to the plurality of terminal corresponding portions 79, portions other than the plurality of circuit corresponding portions 78 are removed.

The terminal corresponding portion 79 is removed by applying a force Px along the −z direction. As described above, the second distance D2 is less than the first distance D1. Therefore, the terminal corresponding portion 79 has a tapered shape that tapers from the first plate surface 701a toward the second plate surface 702a. Thus, even if the terminal corresponding portion 79 is cut from the counter substrate 70a in the cutting step S13, the terminal corresponding portion 79 can be prevented from moving to the −z axis side and coming into contact with the substrate 10a. In addition, the terminal corresponding portion 79 has the tapered shape, thus the terminal corresponding portion 79 can be easily removed by applying a force Px along the −z direction to the terminal corresponding portion 79.

Figure 19:
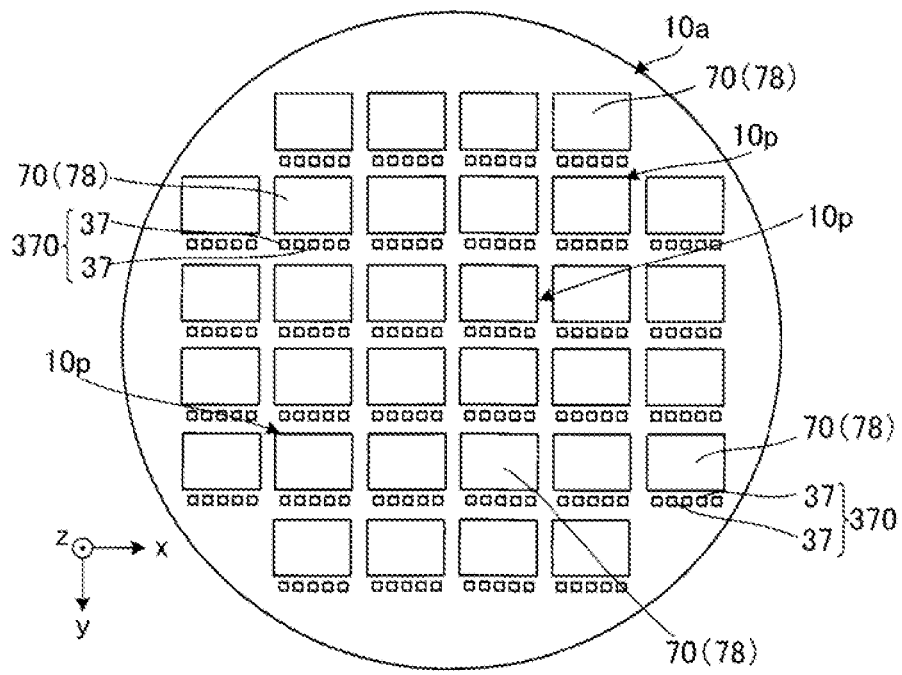
FIG. 19 is a plan view illustrating the terminal corresponding portion removal step according to the first embodiment.

FIG. 19 is a plan view illustrating the terminal corresponding portion removal step S14 according to the first embodiment. By removing the plurality of terminal corresponding portions 79 and the portions other than the plurality of circuit corresponding portions 78, a plurality of counter substrates 70 are formed on the substrate 10a as illustrated in FIG. 18. Note that the counter substrate 70 corresponds to the circuit corresponding portion 78 of the counter substrate 70a. The portion of the circuit corresponding portion 78 of the first plate surface 701a becomes the first plate surface 701 of the counter substrate 70. The portion of the circuit corresponding portion 78 of the second plate surface 702a becomes the second plate surface 702 of the counter substrate 70.

1A-4e. Protective Layer Removal Step S15

Figure 20:
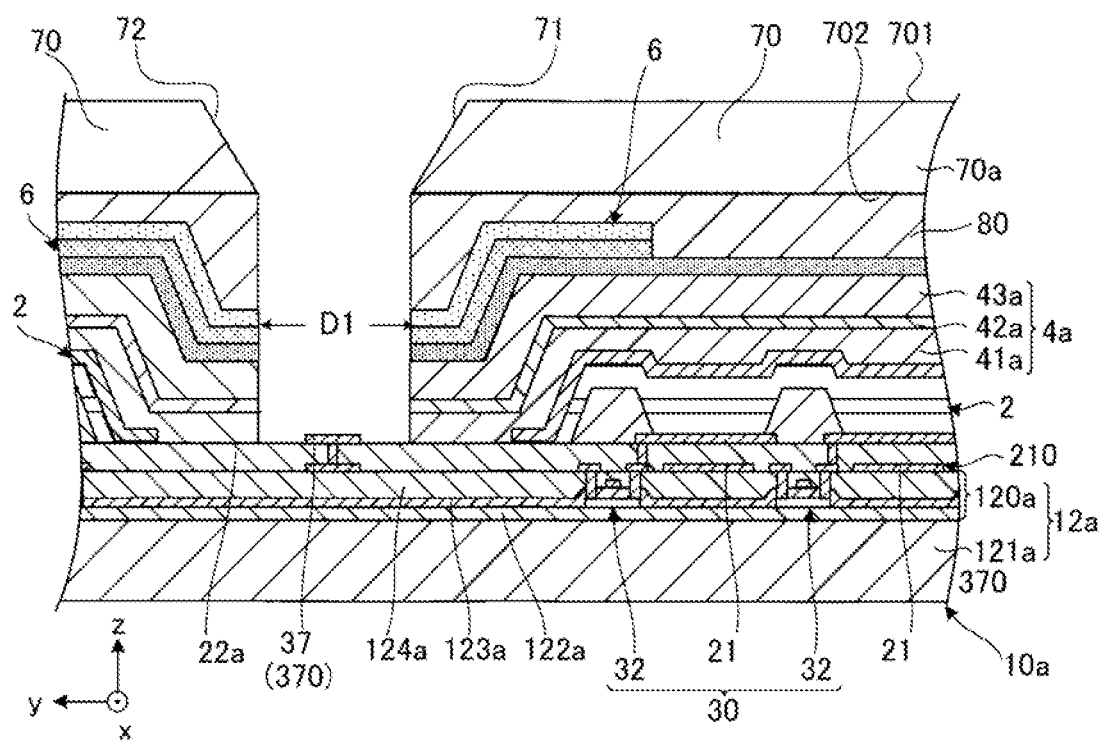
FIG. 20 is an enlarged cross-sectional view illustrating a protective layer removal step according to the first embodiment.

FIG. 20 is an enlarged cross-sectional view illustrating the protective layer removal step S15 according to the first embodiment. As illustrated in FIG. 20, a part of the protective layer 4a is removed by etching, for example. Specifically, portions of the protective layer 4a that do not overlap the plurality of counter substrates 70 are removed from the protective layer 4a. In this removal, portions of the protective layer 4a that overlap the terminal group 370 are removed in plan view. The terminal group 370 is exposed by the removal.

In etching the protective layer 4a, the color filter 6 and the counter substrate 70 can be used as an etching mask. Note that a resist pattern (not illustrated) may be used as the etching mask. Further, the etching may be dry etching. When the protective layer 4a is made of silicon oxide and the like, a fluorine-based gas such as CF4 (carbon tetrafluoride) or CHF3 (carbon trifluoride) is used as an etching gas. Note that, wet etching may be performed instead of dry etching.

In addition, the plurality of first surfaces 71 and the plurality of second surfaces 72 are inclined as described above, thus, as compared to a case where they are orthogonal to the first plate surface 701, the etching gas and the like can efficiently invade into each of the terminals 37. Therefore, the protective layer 4 can be removed and each of the terminals 37 can be easily and highly precisely exposed.

1A-4f. Singulation Step S16

Figure 21:
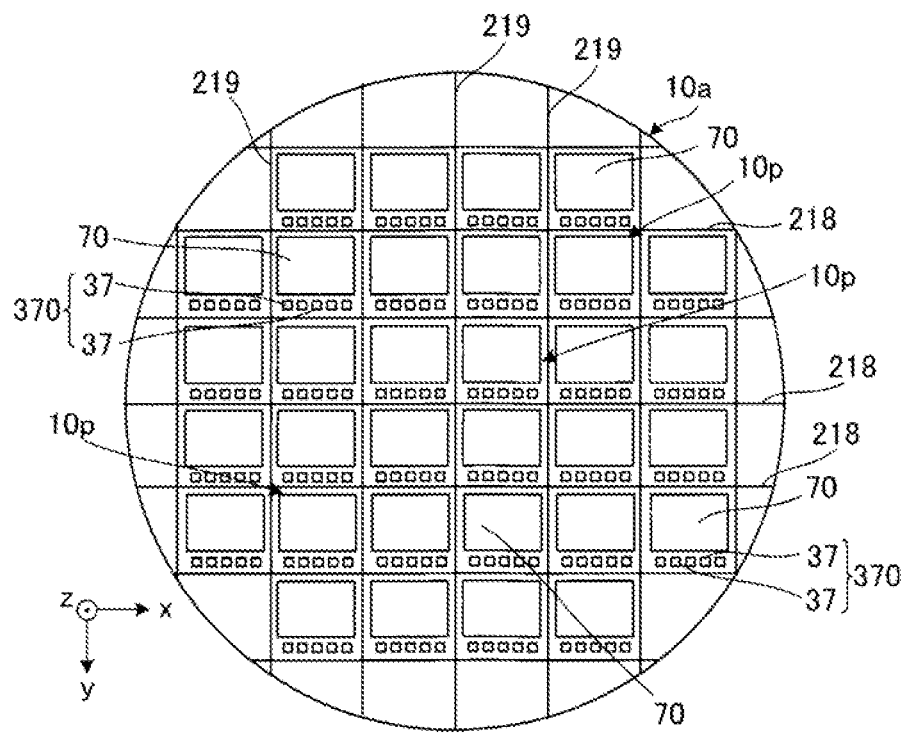
FIG. 21 is a plan view illustrating a singulation step according to the first embodiment.

FIG. 21 is a plan view illustrating a singulation step S16 according to the first embodiment. As illustrated in FIG. 21, the counter substrate 70a is cut into a lattice shape along a plurality of first lines 218 extending in the +x direction in plan view, and a plurality of second lines 219 extending in the +y direction in plan view. The substrate 10a is cut into the plurality of pattern portions 10p by cutting. By cutting, a plurality of display panels 1 are obtained.

Figure 22:
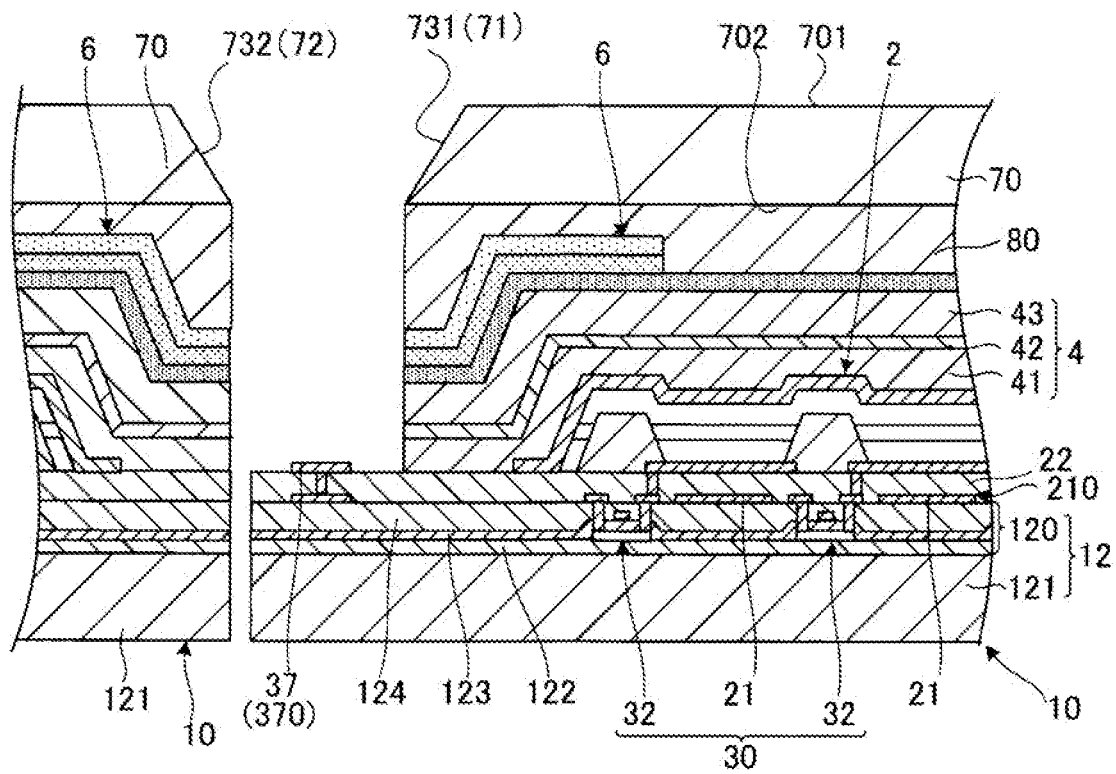
FIG. 22 is an enlarged cross-sectional view illustrating the singulation step according to the first embodiment.

FIG. 22 is an enlarged cross-sectional view illustrating the singulation step S16 according to the first embodiment. For example, as illustrated in FIG. 22, the substrate 10 a is cut at, for example, a position closer to the second surface 72 than the first surface 71 and not overlapping any of the terminals 37. Examples of a method of cutting the substrate 10a include a method using a dicing blade. Note that the method of cutting the substrate 10a is not limited to this, and may be a method of breaking after marking using a diamond tip or the like.

Note that, by cutting, a plurality of first inclined surfaces 731 are formed from the first surface 71 and a plurality of second inclined surfaces 732 are formed from the second surface 72. Further, although not illustrated, a plurality of third inclined surfaces 733 are formed from the third surface 73, and a plurality of fourth inclined surfaces 734 are formed from the fourth surface 74.

As described above, the method for manufacturing the electro-optical device 100 includes the substrate preparation step S11, the bonding step S12, the cutting step S13, and the terminal corresponding portion removal step S14. In the substrate preparation step S11, the substrate 10a is prepared in which the plurality of pixel electrodes 23, the circuit 300 electrically coupled to the plurality of pixel electrodes 23, and the terminal 37 electrically coupled to the circuit 300 are provided. In the bonding step S12, in plan view from the thickness direction of the substrate 10a, the counter substrate 70a is bonded to the substrate 10a to overlap the pixel electrode 23 and the terminal 37. In the cutting step S13, the counter substrate 70a is irradiated with the laser beam LL, and the terminal corresponding portion 79 including the portion overlapping the terminal 37 in plan view is cut from the counter substrate 70a. In the terminal corresponding portion removal step S14, the terminal corresponding portion 79 is removed from the counter substrate 70a.

In this manner, in the method for manufacturing the electro-optical device 100, after bonding the counter substrate 70a to the substrate 10a on which the plurality of pattern portions 10p are formed, the terminal corresponding portion 79 is removed. According to the method for manufacturing the electro-optical device 100, the tact time can be shortened compared to the chip mount method in which the individual counter substrate 70 is bonded to the substrate 10a. Thus, the plurality of electro-optical devices 100 can be manufactured more quickly. In addition, according to the method for manufacturing the electro-optical device 100, the individual counter substrates 70 are not bonded each other, the occurrence of defects in the two adjacent counter substrates 70 overlapping when the individual counter substrates 70 are bonded to the substrate 10a can be prevented. In addition, when bonding the individual counter substrate 70 to the substrate 10a, the counter substrate 70 is prevented from overlapping the terminals 37 in plan view, thus the counter substrate 70 can be prevented from interfering with the terminals 37. In addition, the laser beam LL is used, thus the laser beam LL can suitably cope with miniaturization. Therefore, the terminal corresponding portions 79 can be cut from the counter substrate 70a with high definition. As a result, according to the method for manufacturing the electro-optical device 100, an electro-optical device 100 having stable quality can be efficiently manufactured.

In addition, as described above, in the cutting step S13, the first surface 71 and the second surface 72 sandwiching the terminal corresponding portions 79 in plan view are formed on the counter substrate 70a by the irradiation of the laser beam LL. The first surface 71 and the second surface 72 are inclined with respect to the first plate surface 701 on the opposite side of the counter substrate 70a from the substrate 10a. Further, the first distance D1 between the first surface 71 and the second surface 72 in the first plate surface 701a is greater than the second distance D2 between the first surface 71 and the second surface 72 in the second plate surface 702a on the substrate 10a side of the counter substrate 70a.

By forming the first surface 71 and the second surface 72 such that the first distance D1 is greater than the second distance D2, the tapered terminal corresponding portion 79 tapering from the first plate surface 701a toward the second plate surface 702a can be formed. The terminal corresponding portion 79 has the tapered shape, thus, even if the terminal corresponding portion 79 is cut from the counter substrate 70a, the terminal corresponding portion 79 can be prevented from moving to the −z axis side and coming into contact with the substrate 10a. In addition, the terminal corresponding portion 79 having the tapered shape is formed, thus the terminal corresponding portion 79 can be easily removed by applying a force Px along the −z direction to the terminal corresponding portion 79. As a result, after bonding the counter substrate 70a to the substrate 10a on which the plurality of pattern portions 10p are formed, the method of removing the terminal corresponding portions 79 can be reliably achieved.

Further, in the present embodiment, both the first surface 71 and the second surface 72 are inclined with respect to the first plate surface 701, but in the cutting step S13, only one of the first surface 71 and the second surface 72 sandwiching the terminal corresponding portion 79 may be inclined. In addition, at least one of the third surface 73 and the fourth surface 74 is also inclined, in the terminal corresponding portion removal step S14, the portion other than the circuit corresponding portion 78 in the counter substrate 70a can be efficiently removed.

Further, as described above, the electro-optical device 100 is an organic EL device. Thus, the substrate 10a used in the manufacture includes a light-emitting layer 240 containing a light-emitting material. Further, the substrate 10a includes a protective layer 4a containing a light-transmissive inorganic material that overlaps with the light-emitting layer 240 and the terminal 37 in plan view. Further, the method for manufacturing the electro-optical device 100 includes the protective layer removal step S15 after the terminal corresponding portion removal step S14. In the protective layer removal step S15, the portion of the protective layer 4a overlapping the terminal 37 in plan view is removed.

In the protective layer removal step S15, the counter substrate 70a can be used as an etching mask, thus part of the protective layer 4a can be removed quickly with high definition. In addition, it is not necessary to use other etching masks, thus, it is possible to save the time and labor for positioning the other etching masks. In addition, the first surface 71 and the second surface 72 are inclined such that the first distance D1 is greater than the second distance D2, thus, an etching gas and the like can efficiently invade into the terminal 37 of the protective layer 4a. Therefore, the portion of the protective layer 4a overlapping the terminal 37 in plan view can be removed with high definition.

Further, in the present embodiment, the plurality of display panels 1 are manufactured, but for example, only one display panel 1 may be manufactured. That is, one display panel 1 may be manufactured by bonding one substrate 10 and one counter substrate 70 to form the first surface 71 and the second surface 72, and then removing the terminal corresponding portion 79.

Further, for example, a step of inspecting electrical characteristics may be performed between the protective layer removal step S15 and the singulation step S16. In addition, after the singulation step S16, inspection may be performed on various types of quality of the display panel 1.

1B. Second Embodiment

Figure 23:
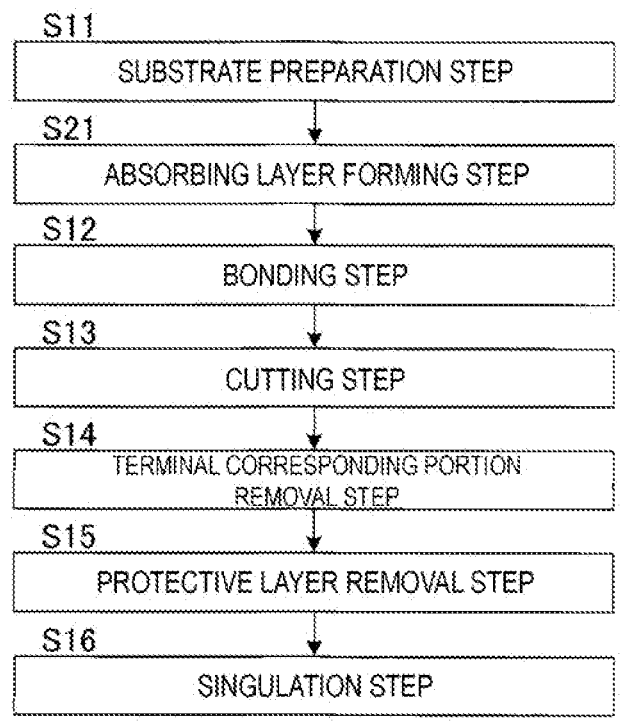
FIG. 23 is a flowchart illustrating a method for manufacturing an electro-optical device according to a second embodiment.
Figure 24:
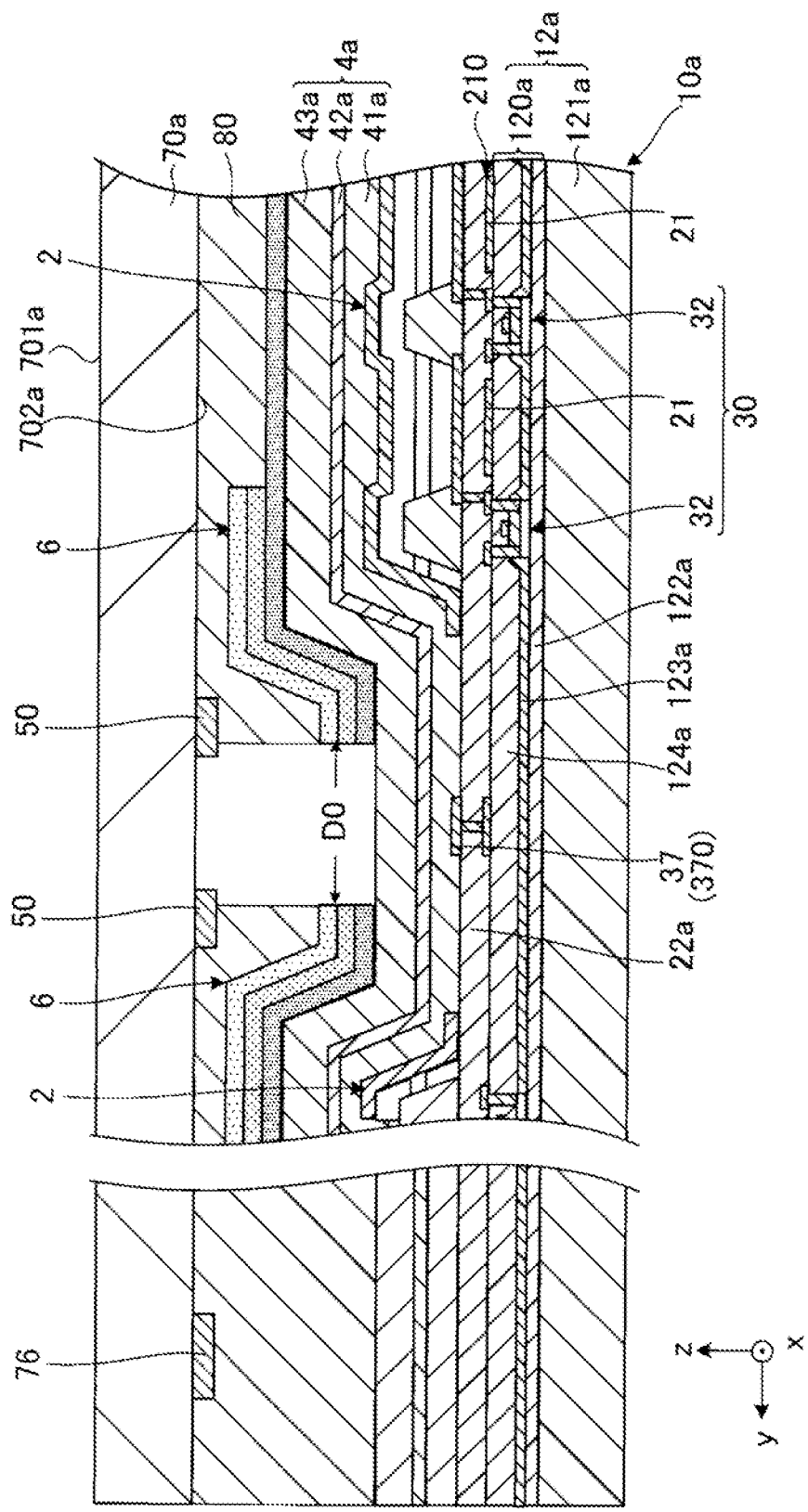
FIG. 24 is an enlarged cross-sectional view illustrating a bonding step according to the second embodiment.
Figure 25:
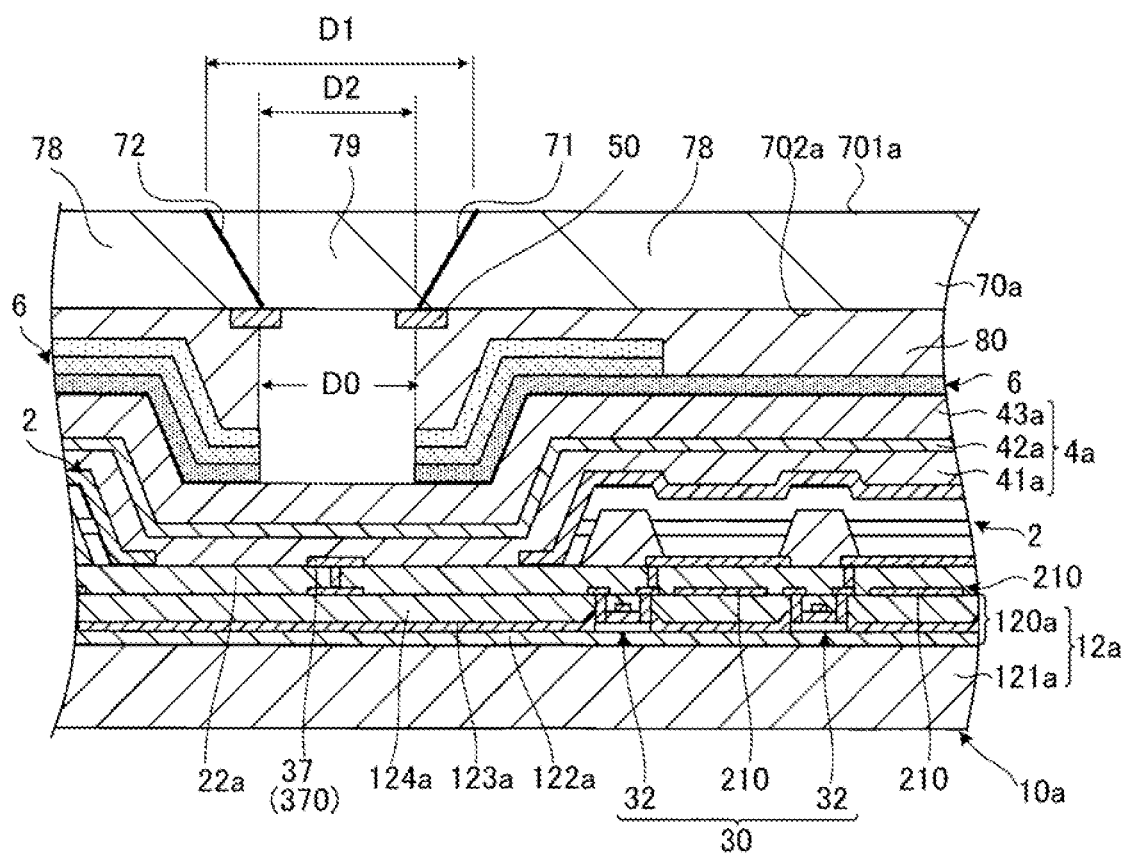
FIG. 25 is an enlarged cross-sectional view illustrating a cutting step according to the second embodiment.

Next, a second embodiment of the present disclosure will be described. FIG. 23 is a flowchart illustrating a method for manufacturing an electro-optical device 100 according to a second embodiment. FIG. 24 is an enlarged cross-sectional view illustrating a bonding step S12 according to the second embodiment. FIG. 25 is an enlarged cross-sectional view illustrating a cutting step S13 according to the second embodiment. The present embodiment differs from the first embodiment in that an absorbing layer 50 is provided. Note that, in the second embodiment, a sign used in the description of the first embodiment is used for the same matter as that of the first embodiment, and each detailed description thereof will be appropriately omitted.

As illustrated in FIG. 23, a method for manufacturing the electro-optical device 100 according to the present embodiment includes an absorbing layer forming step S21 prior to the bonding step S12. In the absorbing layer forming step S21, as illustrated in FIG. 24, a plurality of absorbing layers 50 are formed. The absorbing layer 50 absorbs laser beam LL. The absorbing layer 50 includes a resin material or a metal material containing a colored material. The absorbing layer 50 is arranged in a predetermined portion that is to be irradiated with the laser beam LL in plan view. Thus, as illustrated in FIG. 25, the absorbing layer 50 is formed in a portion overlapping the first surface 71 and the second surface 72 in plan view. Although not illustrated, the absorbing layer 50 is also formed in a portion overlapping the third surface 73 and the fourth surface 74 in plan view. In particular, the absorbing layer 50 overlaps an outer edge of the adhesive layer 80 to cover the outer edge of the adhesive layer 80 in plan view so as to correspond to a portion where the color filter 6 is not arranged. In addition, the absorbing layer 50 is formed to sandwich the plurality of terminals 37 in plan view. By providing the absorbing layer 50, the laser beam LL can be absorbed and attenuated by the absorbing layer 50, thus damage to the substrate 10 due to the laser beam LL can be reduced.

Further, in the absorbing layer forming step S21, as illustrated in FIG. 24, an alignment mark 76 is formed in the same layer as the absorbing layer 50. As described in the first embodiment, the alignment mark 76 is a reference for positioning the irradiation position of the laser beam LL with respect to the counter substrate 70a. By arranging the alignment mark 76 and the absorbing layer 50 in the same layer, the positioning accuracy of the laser beam LL in the thickness direction of the counter substrate 70a can be improved compared to a case where the alignment mark 76 and the absorbing layer 50 are not arranged in the same layer. Further, by locating the alignment mark 76 on the second plate surface 702a side of the counter substrate 70a, the positioning accuracy of the laser beam LL in the thickness direction of the counter substrate 70a of the counter substrate 70a can be improved, as compared with locating on the first plate surface 701a side.

Note that the arrangement of the alignment marks 76 is not limited to this, for example, the alignment marks 76 may be formed on the protective layer 4a. In this case, the absorbing layer forming step S21 is included in the substrate preparation step S11.

1C. Third Embodiment

Figure 26:
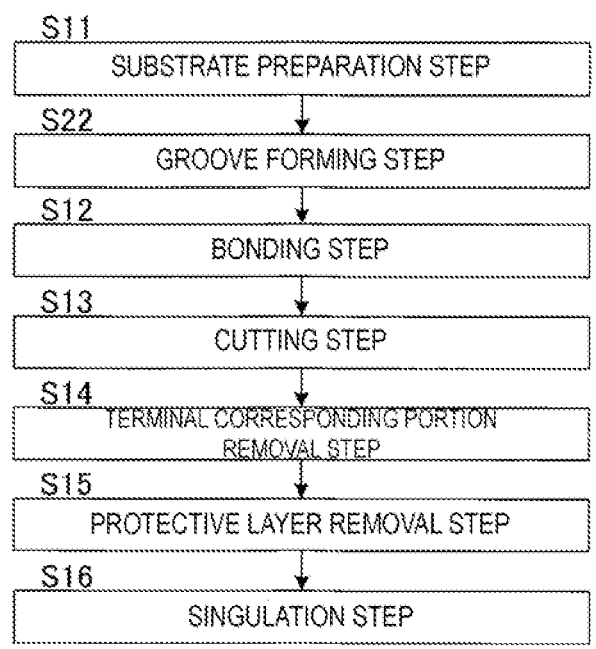
FIG. 26 is a flowchart illustrating a method for manufacturing an electro-optical device according to a third embodiment.
Figure 27:
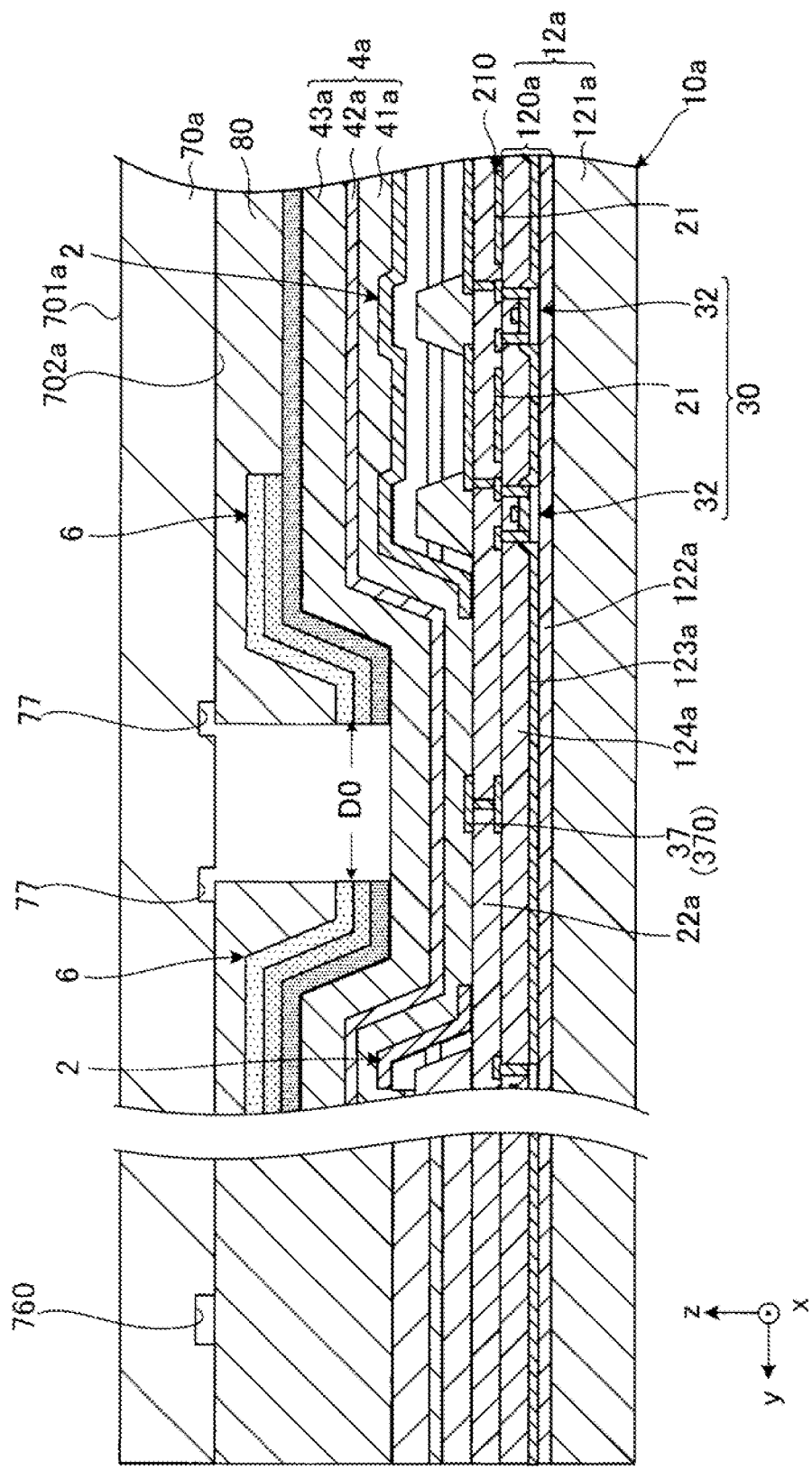
FIG. 27 is an enlarged cross-sectional view illustrating a bonding step according to the third embodiment.
Figure 28:
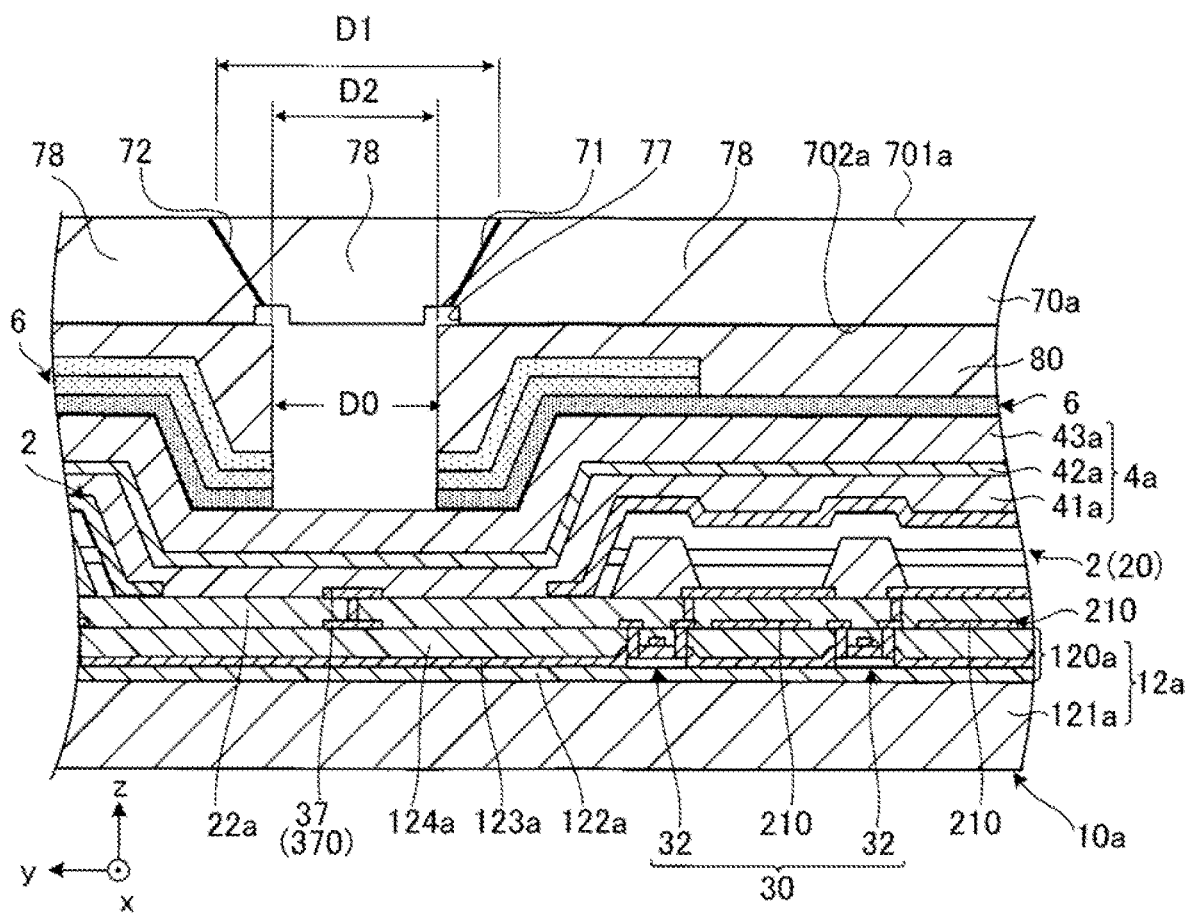
FIG. 28 is an enlarged cross-sectional view illustrating a cutting step according to the third embodiment.

Next, a third embodiment of the present disclosure will be described. FIG. 26 is a flowchart illustrating a method for manufacturing an electro-optical device 100 according to a third embodiment. FIG. 27 is an enlarged cross-sectional view illustrating a bonding step S12 according to the third embodiment. FIG. 28 is an enlarged cross-sectional view illustrating a cutting step S13 according to the second embodiment. The present embodiment differs from the first embodiment in that the counter substrate 70a includes grooves 77. Note that, in the third embodiment, a sign used in the description of the first embodiment is used for the same matter as that of the first embodiment, and each detailed description thereof will be appropriately omitted.

As illustrated in FIG. 26, a method for manufacturing the electro-optical device 100 according to the present embodiment includes a groove forming step S22 prior to the bonding step S12. In the groove forming step S22, a plurality of grooves 77 are formed in the second plate surface 702a of the counter substrate 70a, as illustrated in FIG. 27. The groove 77 attenuates the laser beam LL. The groove 77 is a recess formed in the second plate surface 702a. The groove 77 is arranged at a predetermined position that is to be irradiated with the laser beam LL in plan view. Thus, as illustrated in FIG. 28, the groove 77 is formed at a portion overlapping the first surface 71 and the second surface 72 in plan view. Note that, although not illustrated, the groove 77 is also formed at a portion overlapping the third surface 73 and the fourth surface 74 in plan view. In particular, the groove 77 overlaps an outer edge of the adhesive layer 80 to cover the outer edge of the adhesive layer 80 in plan view. The groove 77 is formed at a position corresponding to the terminal corresponding portion 79. Thus, the groove 77 is formed to sandwich the plurality of terminals 37 in plan view. By providing the grooves 77, the laser beam LL can be cut without approaching the substrate 10 compared to a case without the grooves 77, damage to the substrate 10 due to the laser beam LL can be reduced.

Further, in the absorbing layer forming step S21, as illustrated in FIG. 27, an alignment mark 760 is formed between the substrate 10a and the counter substrate 70a. The alignment mark 760 is formed on the second plate surface 702a of the counter substrate 70a. The alignment mark 760 is a recess formed in the second plate surface 702a. Similar to the alignment mark 76 of the first embodiment, the alignment mark 760 is a reference for positioning the irradiation position of the laser beam LL with respect to the counter substrate 70a. Therefore, by arranging the alignment mark 760 and the groove 77 at substantially the same position in the +z direction, the positioning accuracy of the laser beam LL in the thickness direction of the counter substrate 70a can be improved.

As described above, the electro-optical device 100 which is an organic El device has been described as an example of "electro-optical device", but the "electro-optical device" may be a device other than an organic EL device. For example, the "electro-optical device" may be a liquid crystal device. Further, the "electro-optical device" may be an inorganic EL device using an inorganic EL as a light source. Further, the "electro-optical device" is not limited to the top-emission type, and may be a bottom-emission type in which light generated by the organic EL element 20 is transmitted through the base 121 and emitted. Further, the electro-optical device 100 may not include an optical resonator. Further, the electro-optical device 100 includes the display panel 1 capable of full color display, but may also include a panel for performing a monochromatic display. Further, the electro-optical device 100 may be used as an illumination.

2. Electronic Apparatus

The electro-optical device 100 of the above-described embodiments is applicable to various electronic apparatuses.

2A. Head-Mounted Display

Figure 29:
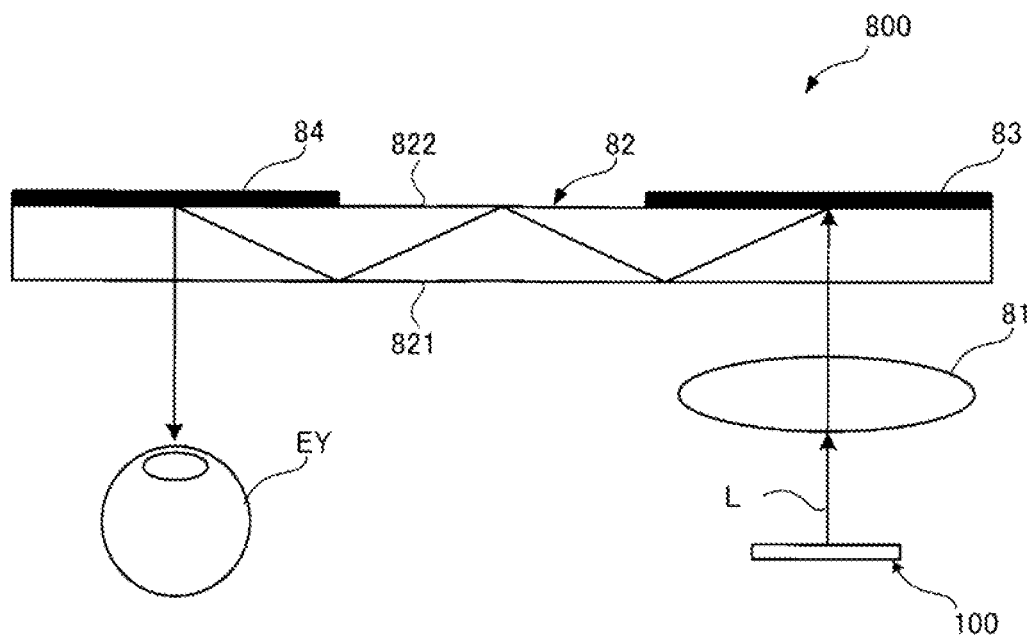
FIG. 29 is a plan view schematically illustrating a part of a virtual display apparatus as an example of an electronic apparatus in the present disclosure.

FIG. 29 is a plan view schematically illustrating a part of a virtual display apparatus 800 as an example of an electronic apparatus in the present disclosure. The virtual display apparatus 800 illustrated in FIG. 29 is a head-mounted display (HMD) mounted on an observer's head and configured to display an image. The virtual display apparatus 800 includes the electro-optical device 100 described above, a collimator 81, a light guide 82, a first reflection-type volume hologram 83, and a second reflection-type volume hologram 84. Note that light emitted from the electro-optical device 100 is emitted as image light L.

The collimator 81 is arranged between the electro-optical device 100 and the light guide 82. The collimator 81 collimates light emitted from the electro-optical device 100. The collimator 81 includes a collimating lens or the like. The light collimated by the collimator 81 is incident on the light guide 82.

The light guide 82 has a flat plate shape, and is arranged so as to extend in a direction intersecting a direction of light incident via the collimator 81. The light guide 82 reflects and guides light therein. A light incident port on which light is incident and a light emission port from which light is emitted are provided in a surface 821 of the light guide 82 facing the collimator 81. The first reflection-type volume hologram 83 as a diffractive optical element and the second reflection-type volume hologram 84 as a diffractive optical element are arranged on a surface 822 of the light guide 82 opposite to the surface 821. The first reflection-type volume hologram 83 is provided closer to the light emission port side than the second reflection-type volume hologram 84. The first reflection-type volume hologram 83 and the second reflection-type volume hologram 84 have interference fringes corresponding to a predetermined wavelength region, and diffract and reflect light in the predetermined wavelength region.

In the virtual display apparatus 800 having such a configuration, the image light L incident on the light guide 82 from the light incident port travels while being repeatedly reflected, and is guided to an eye EY of the observer, and thus the observer can observe an image constituted of a virtual image formed by the image light L.

Here, the virtual display apparatus 800 includes the electro-optical device 100 described above. The electro-optical device 100 described above has good quality. Thus, a high-quality virtual display apparatus 800 can be provided by including the electro-optical device 100.

Note that the virtual display apparatus 800 may include a synthetic element such as a dichroic prism configured to synthesize light emitted from the electro-optical device 100. In this case, the virtual display apparatus 800 may include, for example, an electro-optical device 100 configured to emit light in a blue wavelength region, an electro-optical device 100 configured to emit light in a green wavelength region, and an electro-optical device 100 configured to emit light in a red wavelength region.

2B. Personal Computer

Figure 30:
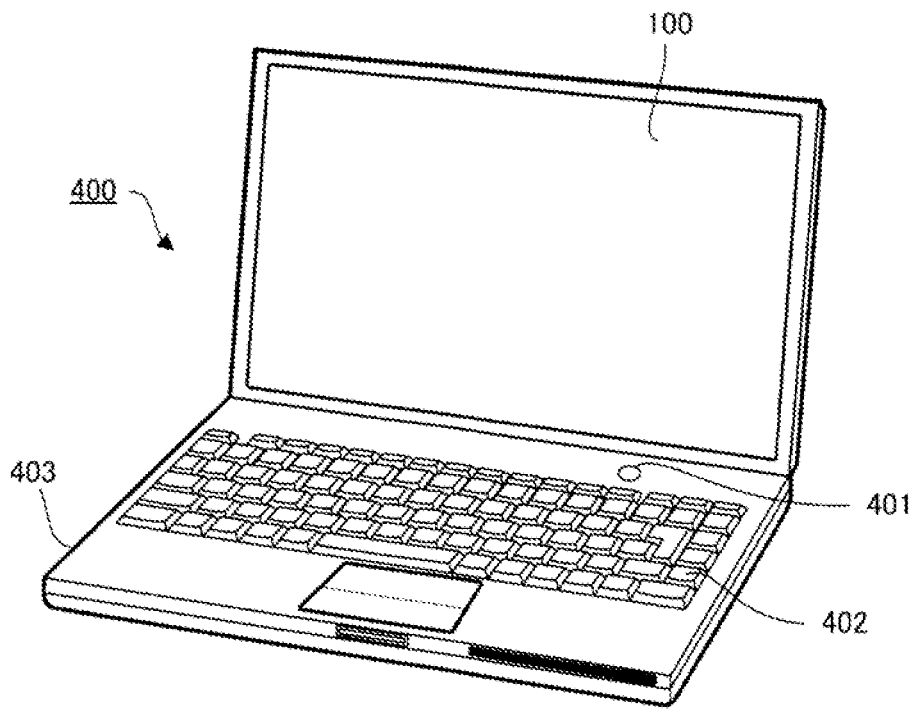
FIG. 30 is a perspective view illustrating a personal computer as an example of the electronic apparatus in the present disclosure.

FIG. 30 is a perspective view illustrating a personal computer 400 as an example of the electronic apparatus in the present disclosure. As illustrated in FIG. 30, a personal computer 400 includes the electro-optical device 100, and a main body 403 provided with a power switch 401 and a keyboard 402. The personal computer 400 includes the above-described electro-optical device 100, and thus has excellent quality.

Note that examples of the "electronic apparatus" including the electro-optical device 100 include, in addition to the virtual display apparatus 800 illustrated in FIG. 29 and the personal computer 400 illustrated in FIG. 30, an apparatus arranged close to eyes such as a digital scope, a digital binocular, a digital still camera, and a video camera. Further, the "electronic apparatus" including the electro-optical device 100 is applied as a mobile phone, a smartphone, a Personal Digital Assistant (PDA), a car navigation device, and a vehicle-mounted display unit. Furthermore, the "electronic device" including the electro-optical device 100 is applied as an illumination for illuminating light.

The present disclosure was described above based on the illustrated embodiments. However, the present disclosure is not limited thereto. In addition, the configuration of each component of the present disclosure may be replaced with any configuration that exerts the equivalent functions of the above-described embodiments, and to which any configuration may be added. Further, any configuration may be combined with each other in the above-described embodiments of the present disclosure.

What is claimed is:

1. A method for manufacturing an electro-optical device comprising:
    bonding a counter substrate to a substrate on which a pixel electrode, a circuit electrically coupled to the pixel electrode, and a terminal electrically coupled to the circuit are provided;
    cutting a first portion corresponding to the terminal from the counter substrate by irradiating the counter substrate with a laser beam;
    removing the first portion from the counter substrate, wherein
        during cutting of the first portion,
            a first surface and a second surface sandwiching the first portion in plan view are formed at the counter substrate by irradiation of the laser beam,
            one or both of the first surface and the second surface are inclined with respect to a first plate surface on an opposite side of the counter substrate to the substrate, and
            a first distance between the first surface and the second surface in the first plate surface is greater than a second distance between the first surface and the second surface in a second plate surface, on the substrate side of the counter substrate; and
    forming a groove at a position on the second plate surface corresponding to the first portion in the plan view, before bonding the counter substrate.

2. The method for manufacturing an electro-optical device according to claim 1, wherein
    the substrate includes a light-emitting layer including a light-emitting material, and a protective layer including an inorganic material and overlapping the light-emitting layer and the terminal in the plan view, and
    after removing the first portion, the method further comprises removing a portion of the protective layer overlapping the terminal in the plan view.

3. The method for manufacturing an electro-optical device according to claim 1, comprising:
    forming an absorbing layer that absorbs the laser beam, before bonding the counter substrate, the absorbing layer including a resin material or a metal material.

4. The method for manufacturing an electro-optical device according to claim 3, wherein
    during formation of the absorbing layer, an alignment mark for positioning an irradiation position of the laser beam with respect to the counter substrate is formed at the same layer as the absorbing layer.

5. The method for manufacturing an electro-optical device according to claim 1, wherein
    before bonding the counter substrate, an alignment mark for positioning an irradiation position of the laser beam with respect to the counter substrate is formed.

6. A method for manufacturing an electroluminescence device comprising:
    forming a protective layer overlapping, in plan view, an organic electroluminescence element, a circuit and a terminal on a circuit board on which the organic electroluminescence element, the circuit electrically coupled to the organic electroluminescence element, and the terminal electrically coupled to the circuit are provided;
    bonding a counter substrate to the protective layer;
    cutting a first portion corresponding to the terminal from the counter substrate by irradiating the counter substrate with a laser beam;
    removing the first portion from the counter substrate;
    removing a portion of the protective layer overlapping the terminal in the plan view, wherein
        during cutting of the first portion,
            a first surface and a second surface sandwiching the first portion in the plan view are formed on the counter substrate by irradiation of the laser beam,
            one or both of the first surface and the second surface are inclined with respect to a first plate surface on an opposite side of the counter substrate to the protective layer, and
            a first distance between the first surface and the second surface in the first plate surface is greater than a second distance between the first surface and the second surface in a second plate surface, on the protective layer side, of the counter substrate; and
    forming a groove at a position on the second plate surface corresponding to the first portion in the plan view, before bonding the counter substrate.

* * * * *